(12) United States Patent
Wang et al.

(10) Patent No.: US 10,934,615 B2
(45) Date of Patent: Mar. 2, 2021

(54) METHOD OF METALLIC COMPONENT SURFACE MODIFICATION FOR ELECTROCHEMICAL APPLICATIONS

(71) Applicant: TREADSTONE TECHNOLOGIES, INC., Princeton, NJ (US)

(72) Inventors: Conghua Wang, West Windsor, NJ (US); Yong Tao, Peoria, IL (US); Lin Zhang, Burlingame, CA (US); Gerald A. Gontarz, Spotswood, NJ (US)

(73) Assignee: TREADSTONE TECHNOLOGIES, INC., Princeton, NJ (US)

( * ) Notice: Subject to any disclaimer, the term of this patent is extended or adjusted under 35 U.S.C. 154(b) by 0 days.

(21) Appl. No.: 16/594,349

(22) Filed: Oct. 7, 2019

(65) Prior Publication Data

US 2020/0102642 A1 Apr. 2, 2020

Related U.S. Application Data

(63) Continuation of application No. 15/130,330, filed on Apr. 15, 2016, now Pat. No. 10,435,782.

(Continued)

(51) Int. Cl.
*C23C 14/02* (2006.01)
*C23C 14/32* (2006.01)
(Continued)

(52) U.S. Cl.
CPC ........... *C23C 14/325* (2013.01); *C21D 6/002* (2013.01); *C21D 9/0068* (2013.01); *C22C 14/00* (2013.01);
(Continued)

(58) Field of Classification Search
CPC ............ C23C 4/08; C23C 4/18; C23C 28/321
(Continued)

(56) References Cited

U.S. PATENT DOCUMENTS 3,623,920 A 11/1971 Kondo et al.
3,755,105 A 8/1973 Messner
(Continued)

FOREIGN PATENT DOCUMENTS

CH 533 691 2/1973
CN 101416294 4/2009
(Continued)

OTHER PUBLICATIONS

A.S. Woodman et al., "Development of Corrosion-Resistant Coatings for Fuel Cell Bipolar Plates", American Electroplaters and Surface Finishers Society, AESF SUR/FIN '99 Prooceedings, Jun. 21-24, 1999.
(Continued)

*Primary Examiner* — Gregory E Webb
(74) *Attorney, Agent, or Firm* — DLA Piper LLP (US)

(57) ABSTRACT

Method for forming a metallic component surface to achieve lower electrical contact resistance. The method comprises modifying a surface chemical composition and creating a micro-textured surface structure of the metallic component that includes small peaks and/or pits. The small peaks and pits have a round or irregular cross-sectional shape with a diameter between 10 nm and 10 microns, a height/depth between 10 nm and 10 microns, and a distribution density between 0.4 million/cm² and 5 billion cm².

13 Claims, 16 Drawing Sheets

Related U.S. Application Data

(60) Provisional application No. 62/147,755, filed on Apr. 15, 2015.

(51) Int. Cl.

| | | |
|---|---|---|
| C23C 4/02 | (2006.01) | |
| C23C 4/08 | (2016.01) | |
| C23C 8/10 | (2006.01) | |
| C23C 14/16 | (2006.01) | |
| C23C 28/00 | (2006.01) | |
| C23F 1/26 | (2006.01) | |
| C25B 15/00 | (2006.01) | |
| H01G 9/055 | (2006.01) | |
| H01G 11/70 | (2013.01) | |
| H01M 8/0206 | (2016.01) | |
| H01M 8/0208 | (2016.01) | |
| H01M 8/0228 | (2016.01) | |
| C21D 6/00 | (2006.01) | |
| C21D 9/00 | (2006.01) | |
| C22C 14/00 | (2006.01) | |
| C22F 1/18 | (2006.01) | |
| C23C 4/12 | (2016.01) | |
| C23C 14/35 | (2006.01) | |
| C23F 1/28 | (2006.01) | |
| C23F 17/00 | (2006.01) | |
| H01M 8/021 | (2016.01) | |
| H01M 8/1018 | (2016.01) | |
| H01M 4/66 | (2006.01) | |

(52) U.S. Cl.
CPC .......... *C22F 1/183* (2013.01); *C23C 4/02* (2013.01); *C23C 4/08* (2013.01); *C23C 4/12* (2013.01); *C23C 8/10* (2013.01); *C23C 14/02* (2013.01); *C23C 14/021* (2013.01); *C23C 14/16* (2013.01); *C23C 14/165* (2013.01); *C23C 14/35* (2013.01); *C23C 28/321* (2013.01); *C23C 28/345* (2013.01); *C23F 1/26* (2013.01); *C23F 1/28* (2013.01); *C23F 17/00* (2013.01); *C25B 15/00* (2013.01); *H01G 9/055* (2013.01); *H01G 11/70* (2013.01); *H01M 8/021* (2013.01); *H01M 8/0206* (2013.01); *H01M 8/0208* (2013.01); *H01M 8/0228* (2013.01); *H01M 8/1018* (2013.01); *H01M 4/661* (2013.01); *H01M 4/662* (2013.01); *H01M 4/667* (2013.01); *H01M 2008/1095* (2013.01); *Y02E 60/13* (2013.01)

(58) Field of Classification Search
USPC .......................................................... 427/448
See application file for complete search history.

(56) References Cited

U.S. PATENT DOCUMENTS

| | | | |
|---|---|---|---|
| 4,031,268 | A | 6/1977 | Fairbairn |
| 4,104,785 | A | 8/1978 | Shiba |
| 4,310,404 | A | 1/1982 | Satoh |
| 4,478,648 | A | 10/1984 | Zeilinger et al. |
| 4,532,191 | A | 7/1985 | Humphries et al. |
| 4,643,818 | A | 2/1987 | Seko et al. |
| 4,666,743 | A | 5/1987 | Ohta et al. |
| 5,098,485 | A | 3/1992 | Evans |
| 5,213,848 | A | 5/1993 | Zurecki et al. |
| 5,290,410 | A | 3/1994 | Tenfalt et al. |
| 5,314,601 | A | 5/1994 | Hardee et al. |
| 5,397,657 | A | 3/1995 | Ito et al. |
| 5,624,769 | A | 4/1997 | Li et al. |
| 5,682,067 | A | 10/1997 | Manley et al. |
| 5,726,524 | A | 3/1998 | Debe |
| 5,785,877 | A | 7/1998 | Sato et al. |
| 6,071,570 | A | 6/2000 | Hardee et al. |
| 6,149,794 | A | 11/2000 | Heimann et al. |
| 6,153,080 | A | 11/2000 | Heimann et al. |
| 6,258,243 | B1 | 7/2001 | Heimann et al. |
| 6,322,687 | B1 | 11/2001 | Heimann et al. |
| 6,372,376 | B1 | 4/2002 | Fronk et al. |
| 6,379,476 | B1 | 4/2002 | Tarutani et al. |
| 6,455,108 | B1 | 9/2002 | Muffoletto et al. |
| 6,475,958 | B1 | 11/2002 | Paul |
| 6,572,756 | B2 | 6/2003 | Heimann et al. |
| 6,592,738 | B2 | 7/2003 | Heimann et al. |
| 6,599,643 | B2 | 7/2003 | Heimann et al. |
| 6,649,031 | B1 | 11/2003 | Iqbal et al. |
| 6,685,988 | B2 | 2/2004 | Van Steenkiste et al. |
| 6,728,092 | B2 | 4/2004 | Hunt et al. |
| 6,761,990 | B1 | 7/2004 | Yoshitake |
| 6,884,363 | B2 | 4/2005 | Ohtani et al. |
| 6,919,543 | B2 | 7/2005 | Abbott |
| 6,924,002 | B2 | 8/2005 | Lee et al. |
| 6,994,779 | B2 | 2/2006 | Heimann et al. |
| 7,052,741 | B2 | 5/2006 | Medeiros et al. |
| 7,070,833 | B2 | 7/2006 | Smith et al. |
| 7,144,628 | B2 | 12/2006 | Kudo et al. |
| 7,144,648 | B2 | 12/2006 | Tawfik et al. |
| 7,254,887 | B2 | 8/2007 | Ishigami et al. |
| 7,309,540 | B2 | 12/2007 | Wang |
| 7,325,432 | B2 | 2/2008 | Ohtani et al. |
| 7,399,532 | B2 | 7/2008 | Seido et al. |
| 7,507,490 | B2 | 3/2009 | Ohtani et al. |
| 7,758,921 | B2 | 7/2010 | Liu et al. |
| 7,763,152 | B2 | 7/2010 | Suzuki et al. |
| 7,838,171 | B2 | 11/2010 | Ohtani et al. |
| 7,846,591 | B2 | 12/2010 | Gu et al. |
| 9,567,681 | B2 * | 2/2017 | Wang ............... C25B 11/04 |
| 9,765,421 | B2 * | 9/2017 | Wang ............... C23C 4/08 |
| 10,435,782 | B2 * | 10/2019 | Wang ............... C23C 14/165 |
| 2001/0050231 | A1 | 12/2001 | Heimann et al. |
| 2002/0012804 | A1 | 1/2002 | Heimann et al. |
| 2002/0054998 | A1 | 5/2002 | Heimann et al. |
| 2002/0102400 | A1 | 8/2002 | Gorokhovsky et al. |
| 2002/0150687 | A1 | 10/2002 | Matsuba |
| 2002/0151161 | A1 | 10/2002 | Furusawa |
| 2002/0168466 | A1 | 11/2002 | Tapphorn et al. |
| 2003/0124427 | A1 | 7/2003 | Takeuchi et al. |
| 2003/0178317 | A1 | 9/2003 | Heimann et al. |
| 2003/0235711 | A1 | 12/2003 | Seido et al. |
| 2004/0081881 | A1 | 4/2004 | Vyas et al. |
| 2004/0086689 | A1 | 5/2004 | Takahashi |
| 2004/0131943 | A1 | 7/2004 | Brown et al. |
| 2004/0197661 | A1 | 10/2004 | Utsunomiya et al. |
| 2005/0026020 | A1 | 2/2005 | Franklin |
| 2005/0089742 | A1 | 4/2005 | Ishigami et al. |
| 2005/0158621 | A1 | 7/2005 | Benoit et al. |
| 2005/0260473 | A1 | 11/2005 | Wang |
| 2005/0266161 | A1 | 12/2005 | Medeiros et al. |
| 2005/0275330 | A1 | 12/2005 | Sung |
| 2006/0003174 | A1 | 1/2006 | Yashiki et al. |
| 2006/0011490 | A1 | 1/2006 | Nguyen et al. |
| 2006/0019142 | A1 | 1/2006 | Abd Elhamid et al. |
| 2006/0094309 | A1 | 5/2006 | Holtkamp et al. |
| 2006/0222777 | A1 | 10/2006 | Skoog et al. |
| 2007/0015034 | A1 | 1/2007 | Vyas et al. |
| 2007/0023290 | A1 | 2/2007 | Hawkins et al. |
| 2007/0138147 | A1 | 6/2007 | Molz et al. |
| 2007/0248832 | A1 | 10/2007 | Maeda et al. |
| 2008/0085439 | A1 | 4/2008 | Hilliard |
| 2008/0145633 | A1 | 6/2008 | Kodas et al. |
| 2008/0220234 | A1 | 9/2008 | Ko et al. |
| 2009/0176120 | A1 * | 7/2009 | Wang ............... C23C 4/08 428/601 |
| 2010/0006425 | A1 | 1/2010 | Fu et al. |
| 2010/0021634 | A1 | 1/2010 | Kodas et al. |
| 2010/0055494 | A1 | 3/2010 | Gillesberg et al. |
| 2010/0133111 | A1 | 6/2010 | Nocera et al. |
| 2010/0151267 | A1 | 6/2010 | Kodas et al. |
| 2010/0143781 | A1 | 7/2010 | Keshavarz et al. |
| 2010/0285386 | A1 | 11/2010 | Wang |
| 2011/0059570 | A1 | 3/2011 | Kuebelbeck et al. |

(56) References Cited

U.S. PATENT DOCUMENTS

| | | | |
|---|---|---|---|
| 2011/0070493 A1 | 3/2011 | Gadkaree et al. | |
| 2011/0076587 A1* | 3/2011 | Wang | H01M 8/0206 429/465 |
| 2011/0091789 A1 | 4/2011 | Mofakhami et al. | |
| 2012/0103828 A1 | 5/2012 | Bulan et al. | |
| 2012/0145532 A1 | 6/2012 | Smolyakov et al. | |
| 2013/0230793 A1* | 9/2013 | Wang | H01M 8/0208 429/509 |
| 2014/0224650 A1* | 8/2014 | Wang | C25B 11/0494 204/268 |
| 2014/0242462 A1* | 8/2014 | Wang | H01M 10/365 429/218.1 |
| 2015/0147678 A1 | 5/2015 | Kihira et al. | |
| 2015/0325864 A1 | 11/2015 | Nishimoto et al. | |
| 2016/0250394 A1 | 9/2016 | Pawar et al. | |
| 2016/0305011 A1* | 10/2016 | Wang | C23C 14/325 |
| 2016/0308222 A1 | 10/2016 | Takahashi et al. | |
| 2016/0329575 A1 | 11/2016 | Takahashi et al. | |
| 2016/0344127 A1* | 11/2016 | Drew | C23C 24/04 |
| 2017/0077527 A1 | 3/2017 | Imamura et al. | |
| 2017/0165036 A1 | 6/2017 | Ceausu et al. | |

FOREIGN PATENT DOCUMENTS

| | | |
|---|---|---|
| CN | 101490301 | 7/2009 |
| CN | 103031523 | 4/2013 |
| EP | 1107340 | 6/2001 |
| EP | 1 369 504 | 12/2003 |
| EP | 1 808 920 | 7/2007 |
| EP | 1 847 628 | 10/2007 |
| JP | 2003-268567 | 9/2003 |
| KR | 10-2006-0106865 | 10/2006 |
| TW | 200719508 | 5/2007 |
| WO | WO 02/059936 | 8/2002 |
| WO | WO 2004/052559 | 6/2004 |
| WO | WO 2005/085490 | 9/2005 |
| WO | WO 2007/149881 | 12/2007 |

OTHER PUBLICATIONS

D.S.R. Krishna et al., "Effect of Thermal Oxidation Conditions on Tribological Behaviour of Titanium Films on 316L Stainless Steel", Science Direct Surface & Coating Technology, vol. 198, pp. 447-453 (2005).

J. Berghaus et al., "Suspension Plasma Spraying of Nanostructured WC-12Co Coatings", Journal of Thermal Spray Technology, vol. 15(4), pp. 676-681, Dec. 2006.

Erich Lugscheider et al., "Reactive Plasma Spraying of Titanium", Advanced Engineering Materials, vol. 2, No. 5, pp. 281-284 (2000).

English language abstract of KR 10-2006-0106865, published Oct. 12, 2006.

English language abstract of CH 533,691, published Feb. 15, 1973.

Machine English language translation of CH 533,691, published Feb. 15, 1973.

"Thermal Spraying: Practice, Theory, and Application", American Welding Society, pp. 3, 31, and 32 (1985).

Tzeng, et al. "Electrical Contacting Techniques for High TC Superconductor Applications", Superconductivity and Its Applications, 1998, pp. 174-179.

Yamada, et al. "Nitridation of aluminum particles and formation process of aluminum nitride coatings by reactive RF plasma spraying," Thin Solid Films 515 (2007), pp. 4166-4171.

Bacci et al. "Reactive plasma spraying of titanium in nitrogen containing plasma gas", Materials Science and Engineering A283 (2000), pp. 189-195.

"Laser Plating and Melting for Hard metal Surfaces", IBM Technical Disclosure Bulletin, vol. 26, No. 7A, Dec. 1, 1983.

English language abstract and translation of JP 2003-268567 published Sep. 25, 2003.

P. Gougeon et al., "Simultaneous Independent Measurement of Splat Diameter and Cooling Time during Impact on a Substrate of Plasma-Sprayed Molybdenum Particles", Journal of Thermal Spray Technology, vol. 10, No. 1, pp. 76-82, Mar. 2001.

J.W. Luster et al., "Formation and Characterization of Corrosion Resistant Amorphous Coating by Thermal Spraying", In Surface Modification Technologies IX, pp. 479-493 (1996).

L.C. Erickson et al., "Alumina Coatings by Plasma Spraying of Monosize Sapphire Particles", Journal of Thermal Spray Technology, vol. 8, No. 3, pp. 421-426. Sep. 1999.

International Search Report issued in PCT/2016/027827 dated Oct. 4, 2016.

Written Opinion issued in PCT/2016/027827 dated Oct. 4, 2016.

European Search Report issued in 16780869 dated Nov. 14, 2018.

Chinese Office Action issued in 201680021911 dated Sep. 28, 2018.

English language abstract of CN 101490301, published Jul. 22, 2009.

English language abstract of CN 103031523, published Apr. 10, 2013.

English language abstract of TW 200719508, published May 16, 2007.

English language abstract of CN 101416294, published Apr. 22, 2009.

* cited by examiner

METHOD OF METALLIC COMPONENT SURFACE MODIFICATION FOR ELECTROCHEMICAL APPLICATIONS

CROSS-REFERENCE TO RELATED APPLICATIONS

This application is a continuation application to U.S. application Ser. No. 15/130,330 filed on Apr. 15, 2016, which claims priority to U.S. Provisional Application No. 62/147,755 filed Apr. 15, 2015, which is incorporated by reference in their entireties.

FIELD OF THE INVENTION

Embodiments of the invention relate to reducing the surface electrical contact resistance of metallic components for electrochemical applications in, including, but not limited to, fuel cells, electrolysis cells, batteries and capacitors. More specifically, the embodiments relate to methods for improving the surface electrical conductance of metallic components by surface morphology and chemical composition modification.

BACKGROUND

In numerous electrochemical devices, some metallic components need a low electrical surface contact resistance with adjacent components. The metallic components could be electrodes, current collectors, mass (gas or liquid) diffusion layers, or the multifunction components, such as bipolar plates in fuel cells and electrolysis cells. The metallic components must also be corrosion resistant in the operational environment to ensure long term, stable operation. However, most corrosion resistance metals and alloys rely on a surface oxide layer for corrosion protection, and the surface oxide layer is not electrically conductive.

One example application is the metallic components in electrolysis cells. An electrolyzer is an electrochemical device that performs chemical reactions using electrical power. The typical reactions include splitting water to hydrogen and oxygen, or converting sodium chloride to chlorine gas and sodium hydroxide. A practical electrolyzer includes multiple cells for sufficient production capacity. These cells are connected in series using bipolar plates to build a stack with other necessary hardware such as gas diffusion layers, end plates, cell frames, gaskets, etc. These components are exposed to high electrochemical potential during operation. Metallic components, typically made of commercial pure titanium, will be continually oxidized resulting in a thicker surface oxide layer and higher electrical contact resistance. The high surface electrical contact resistance will lead to the high internal energy loss of the electrolysis cells. The current solution is to electrically plate the component with a layer of platinum to ensure low surface electrical contact resistance. The high material cost of platinum prohibits the broader commercial applications.

Another example application is the current collector of a lithium battery. The function of the current collector is to collect electrons to and from electrode active materials to maintain the battery's operation. It is desired to have low surface electrical contact resistance in high voltage operational conditions. Commercial 3.6V lithium ion batteries based on the $LiPF_6$ electrolyte use a high purity aluminum foil as the current collector. It works fine in small to medium power batteries. However, both electrical current density and operating voltage of high power lithium batteries are much higher than conventional applications. The internal ohmic loss is high (under high electrical current) and the aluminum is not stable (under high voltage). More surface conductive and corrosion resistant current collector material is needed for high power lithium batteries.

One further example is the bipolar plates in proton exchange membrane (PEM) fuel cell stacks. The function of the bipolar separate plate is to 1) separate the hydrogen of one cell from the air of the adjacent cell; 2) collect electrons to/from the electrodes; 3) facilitate mass (gas and water) transport in cells and 4) maintain the proper operational temperature of the stack. The operational condition inside the PEM fuel cell is very corrosive (high potential, in acid solutions). The electrical current density is very high (2-4 $A/cm^2$). Bipolar plates made of metal foil, such as stainless steel foil, have advantages such as light weight and higher thermal conductance than that of traditional graphite plates. However, it is a challenge to maintain low electrical contact resistance of a metal plate with a gas diffusion layer (the component in direct contact with bipolar plates), due to the resistivity of the surface oxide layer of corrosion resistant metal plates.

The electrical contact resistance and corrosion resistance requirements are dependent on the specific applications. For example, the metallic components in PEM electrolysis cell must have a corrosion resistance that is suitable for over 10 years of stable operation in a slightly acidic solution at high electrochemical potential (over 2.0 $V_{NHE}$) with electrical contact resistance below 2 $m\Omega \cdot cm^2$ with a porous titanium gas diffusion layer. In PEM fuel cells, the metallic bipolar plates must have sufficient corrosion resistance for stable operation over 6,000 hours in an acid solution under an electrical potential over 0.8 $V_{NHE}$ at 80-90° C. The surface electrical contact resistance must be below 10 $m\Omega \cdot cm^2$ with a carbon felt gas diffusion layer. The current collector for lithium batteries has to be stable in the organic salt electrolyte solutions (typically containing fluorine) at high potential (up to 5 $V_{Li/Li+}$). The surface electrical contact resistance of the current collector with electrode should be below 100 $m\Omega \cdot cm^2$. The requirements for a capacitor current collector are also related to the chemical systems (aqueous or organic electrolyte based) and the operational current density of super-capacitors are at a much high current density than that of traditional capacitors. Therefore, lower resistant current collectors are desired.

In electrochemical devices, metallic components, as a solid piece, are in contact with other solid components, in most cases, under certain compression pressure. It is well known that the solid-to-solid electrical contact is built on the direct contact of high points of the solid surface. The common way to reduce the electrical contact resistance is to use soft materials, such as gold, silver, tin and copper, that can be deformed under the pressure to increase the contact area between solid components. An example of this type of surface modification is taught in U.S. Pat. No. 6,685,988, which deposits tin on a metal surface to reduce the electrical contact resistance. However, these soft materials are either too expansive or lack the desired corrosion resistance for electrochemical applications.

Various methods have been taught for these applications. U.S. Pat. No. 6,379,476 teaches a special stainless steel alloy that has electrical conductive inclusions for PEM fuel cell applications. The surface oxide layer of the special alloy can protect the stainless steel from corrosion in PEM fuel cells, and the electrical conductive inclusions can maintain the low surface electrical contact resistance. US patent application publication no. 2005/0089742 teaches a method to etch off the surface metallic layer of the alloy similar to the one taught in U.S. Pat. No. 6,379,476 to expose the electrical conductive inclusions as the electrical contact point.

U.S. Pat. No. 6,723,462 no. teaches a special chromium-nickel austenitic alloy that can form a more electrical conductive surface oxide than regular stainless steel, such as commercial available 316 L. It can be used as the bipolar plates for PEM fuel cells.

U.S. Pat. No. 5,098,485 teaches a method to convert the electrical insulating, native poorly conductive surface oxide layer of metallic components to more electrically conductive surface for capacitor applications.

WO 2007/013508 teaches a Ti alloy with precious metal elements. The precious metal in the alloy will lead to the formation of a precious metal and titanium oxide composite surface layer that has low surface electrical resistance. It can be used as an electrode or bipolar plates in fuel cells.

In addition to the development of special alloys that have low electrically resistive surface oxide layer, another widely used approach is to coat the metallic components with corrosion resistant and surface electrical conductive materials, typically precious metals. US patent application publication no. 2003/0124427 teaches a method to deposit a thin layer of gold on titanium plate by sputtering process. The gold coated titanium plate is used as the current collector in nonaqueous Li/CF$_x$ cells. Platinum coated titanium has been widely used in electrolyzers. Gold coated stainless steel plates were also used for PEM fuel cell applications. In general, the corrosion resistance and electrical conductive coating on a low cost substrate material is a practical approach for various applications, as long as the coating material has reasonable cost, and the coating process is reliable and low cost.

Neil Aukland reported a group of low surface electrical contact resistance titanium alloys that contain 1-3 atomic % niobium or tantalum (J. Mater. Res., Vol. 19, No. 6, pp. 1723-1729, June 2004). This alloy can form a semi-conductive niobium doped titanium oxide (or tantalum doped titanium oxide) surface layer that leads to lower surface electrical contact resistance than pure titanium. This method has the advantage of low metal cost by eliminating precious metal. However, its surface electrical contact resistance is still too high for PEM fuel cell applications.

Therefore, it is desired to have metallic components that have high corrosion resistance and low surface electrical contact resistance for electrochemical applications. It could be either a special alloy or a coating on a metallic components. Methods for the alloy and the coating production and surface treatment are also needed to produce low cost, durable metallic components for electrochemical applications.

SUMMARY OF THE INVENTION

Disclosed embodiments provide a method for forming a metallic component surface to achieve lower electrical contact resistance. The method comprises modifying a surface of the metallic component to form small peaks and pits that are capable of serving as high-pressure contact points with other solid components of a device of which the metallic component is a part. The small peaks and pits have a diameter between 10 nm and 10 microns, a height between 10 nm and 10 microns, and a distribution density between 0.4 million/cm$^2$ and 5 billion cm$^2$. The method also comprises modifying the surface oxide layer composition of Ti alloy or Ti alloy coating to obtain the more electrical conductive surface oxide layer.

DETAILED DESCRIPTION

Figure 1:
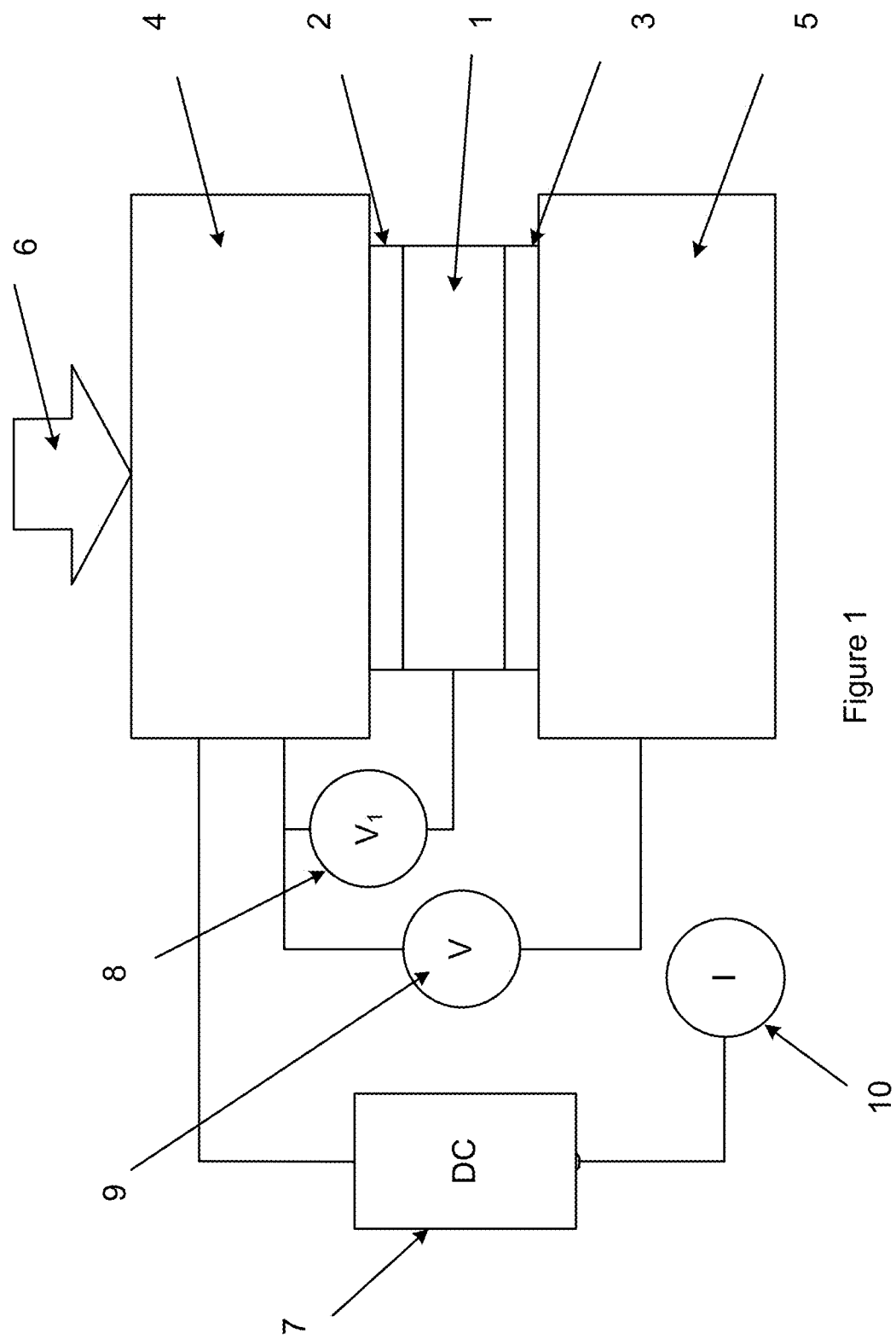
FIG. 1 is the set up for the surface electrical contact resistance measurement.

In the following detailed description, a plurality of specific details, such as types of materials and dimensions, are set forth in order to provide a thorough understanding of the preferred embodiments discussed below. The details discussed in connection with the preferred embodiments should not be understood to limit the claimed inventions. Furthermore, for ease of understanding, certain method steps are delineated as separate steps; however, these steps should not be construed as necessarily distinct nor order dependent in their performance.

An object of the embodiments disclosed herein is to provide a metal surface structure and treatment process to provide low surface electrical contact resistance and maintain high corrosion resistance. The metal surface morphology modification is used to achieve the objective. More specifically, the metal surface morphology modification is to convert the surface to a micro-textured structure that includes tremendous amounts of standouts, peaks, spikes, valleys, pits. The micro-textured structure creates a tremendous amount of high pressure contacting points and more actual contacting areas that can reduce the surface electrical contact resistance of the component.

Another object of the embodiments disclosed herein is to provide methods to modify surface oxide chemical composition of titanium alloy and titanium alloy coating on metallic component to obtain an electrical conductive oxide surface layer. More specifically, the surface oxide is grown on the titanium alloy surface by the reaction of titanium alloy with oxygen. Its composition is tailored to have higher niobium or tantalum concentration than that in the alloy to achieve higher electrical conductance of the oxide surface layer.

As used herein, the symbol "%" refers to atomic % of all metallic elements in the alloy or oxide (metal based concentration), unless otherwise noted. High valance elements are elements whose cations have the valance more than +4. Examples of high valance element are niobium, tantalum, vanadium, molybdenum, and tungsten. Low valance elements are elements whose cations have the valance of +4 or less. Examples of low valance element are aluminum, zirconium, hafnium, yttrium, iron, nickel, and chromium.

In this description, doped titanium oxide is the mixture of titanium oxide with other metal oxide. Titanium is the dominating metallic element in the mixture. The minor metallic elements are called dopants. For example, 5% niobium doped titanium oxide has the formulation of $Nb_{0.05}Ti_{0.95}O_x$. The oxygen content x is between 2 and 1, which is related to the dopant concentration and processing condition of the doped titanium oxide.

In this description, doped titanium oxide can be also described as the weighted average valance of all metallic elements, including titanium, in the oxide layer. The valance of titanium in the calculation is +4, despite the fact that titanium may also be present in +2 and +3 valance status in the doped oxide. The equation of the calculation for oxide with formulation of $A^{+6}_m B^{+5}_n C^{+4}_o D^{+3}_p E^{+2}_q O_x$ is.

Weighted Valance=6m+5n+4o+3p+2q, where m, n, o, p and q are the atomic concentration of metallic elements and m+n+o+p+q=1. For example, the weighted average valance of $Nb_{0.08}Al_{0.02}Ti_{0.9}O_x$ is equal to 0.08×5+0.02×3+0.9×4=+ 4.06. In the same calculation, the weighted average valance of pure titanium dioxide ($TiO_2$) is +4, and $Nb_{0.05}Ti_{0.95}O_x$ is +4.05.

In this description, doped niobium pentoxide is the mixture of niobium pentoxide with other metal oxide. Niobium is the dominating metallic element in the mixture. The minor metallic elements are called dopants. For example, 10% titanium doped niobium pentoxide has the formulation of $Ti_{0.2}Nb_{1.8}O_x$. The oxygen content x is between 5 and 4.

In this description, the surface layer composition is determined by auger electron spectroscopy (AES) or X-ray Photoelectron Spectroscopy (XPS) that detects chemical composition in the depth of 5-9 nm from the surface. Other methods may detect the surface composition with different depth range, but are not used in this description.

In this description, some embodiments include the metal surface morphology that has stand-outs, spikes, peaks, valleys and pits. The term "peaks" is used to describe all surface features that stand out of the substrate surface, such as spikes, stand-outs and peaks. The term "pits" is used to describe all surface features that are below the substrate surface, such as valleys and pits. The dimension of these peaks and pits are characterized as the height and width. The height is the vertical distance between the top and bottom of peaks. The depth is the vertical distance between the top and bottom of the pits. The width for round shaped peaks and pits is the diameter at the half height (or depth). Irregularly shaped peaks and pits can be characterized as the closest sized round shape, or multiple round shapes joined together. The width of narrow sheet shape peaks and pits are characterized by the width at the half height (or depth). All dimensions are the statistically average value.

An advantage of the disclosed methods is that they can produce, at a low cost, metal components for electrochemical application that need high electrical conductance and corrosion resistance for long term operation.

FIG. 1 is the fixture used in the disclosed embodiments to measure the surface electrical contact resistance (CR). Reference numeral 1 is a sample of a metallic component under measurement, typically a flat metal plate. Reference numerals 2 and 3 are the contacting elements that are pressed on sample 1. Reference numerals 4 and 5 are electrodes that press elements 2 and 3 on sample 1. Reference numeral 6 is a presser that provides the compression force on the assembly of components 1-5. The typical material of contacting elements 2 and 3 are porous carbon felt sheets, such as TGP-H-060 Toray paper. Platinum coated titanium meshes are also used as the contacting elements 2 and 3 for some applications. The electrodes 4 and 5 are gold coated stainless steel. Reference numeral 7 is a DC power source that provides DC current (I) through the assembly of components 1-5. Reference numeral 8 is a voltmeter that measures the voltage drop between electrode 4 and sample 1 ($V_1$). Reference numeral 9 is another voltmeter that measures the voltage drop between two electrodes 4 and 5 (V). Reference numeral 10 is an ammeter that measures the current passing through the assembly of components 1-5. The typical contacting area between sample 1 and contacting elements 2 and 3 is at the size of 1 square inch and the DC electrical current is 6.45 A, which makes the electrical current density (i) passing through the contacting elements (2 and 3) and sample 1 contacting surface at 1 A/cm$^2$.

During the measurement, the voltage drops (V and $V_1$) between electrodes 4 and 5, and electrode 4 with sample 1 are measured, at first. Then the voltage drop ($V_{base}$) between electrode 4 and 5 is measured with contact elements 2 and 3 only (without sample 1) as the baseline. The surface contact resistance (CR) of contacting element 2 with sample 1 is calculated as:

$$CR=(V_1-V_{base}/2)/i$$

The through plate resistance (TPR) of the sample is calculated as:

$$TPR=(V-V_{base})/i$$

Because the bulk resistance of metallic component is very small, the TPR is actually the sum of the surface contact resistance of the sample 1 with contacting element 2 ($CR_{1-2}$) and sample 1 with contacting element 3 ($CR_{1-3}$).

$$TPR=CR_{1-2}+CR_{1-3}$$

The surface electrical contact resistance measurement is normally conducted with the compression pressure between 15 psi and 300 psi that represents the pressure range for difference applications. For example, the compression pressure is ~15 psi in lithium batteries and capacitors, 100-200 psi in PEM fuel cells; and much higher in high pressure electrolyzers. The pressure is needed to compress all cell components together to achieve the best performance.

Figure 2A:
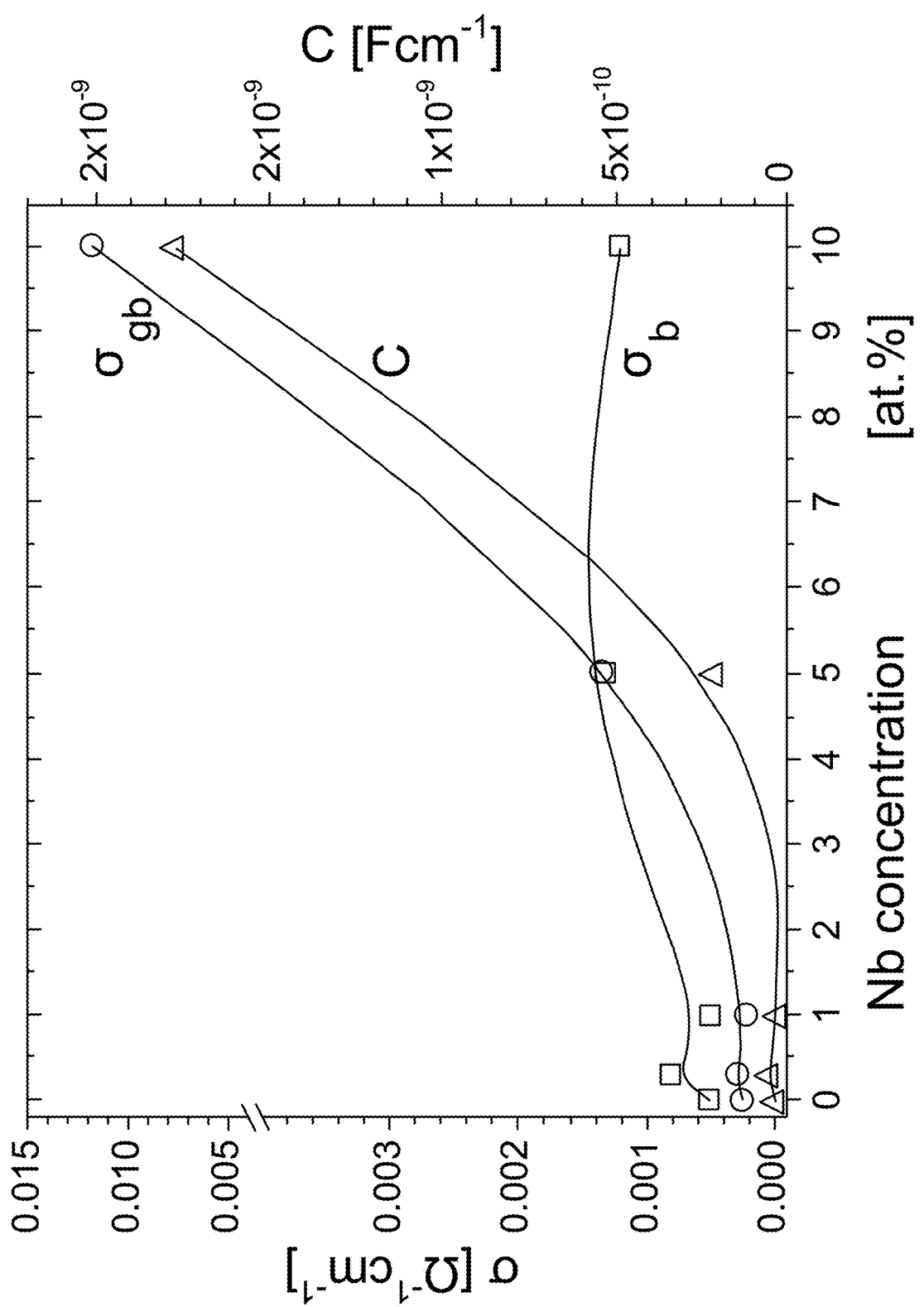
FIG. 2A is the relation of electrical conductance of niobium doped titanium oxide with the concentration of niobium.

Although titanium oxide is an electrical insulator, it can be changed to semi-conductive by doping a high valance element ($M^{+5}$, $M^{+6}$ or $M^{+7}$, M is a metallic element). The high valance elements include niobium, tantalum, vanadium, molybdenum, and tungsten. The electrical conductivity of the doped titanium oxide is determined by the dopant concentration. FIG. 2A shows the relation of the electrical conductance of niobium doped titanium oxide with the concentration of niobium. It shows that niobium doped titanium oxide reaches the highest bulk conductance ($\sigma_b$) with the niobium concentration between 5-7%. On the other hand, the grain boundary conductivity ($\sigma_{gb}$) is related to the fabrication process. It could reach the highest conductivity at a much higher concentration of niobium in titanium oxide, reported by A. Trenczek-Zajac and M. Rekas in Materials Science-Poland, Vol. 24, No. 1, 2006.

In addition, if the dopant concentration is too high, the doped titanium oxide cannot maintain titanium dioxide crystal structure, such as rutile, anatase or brookite structure, the doped titanium oxide will lose its semi-conductive properties, and change back to an insulator. It was reported that the non-conductive $TiNb_2O_7$ phase was found if the niobium concentration is higher than 15%. Therefore, it is desired to obtain the optimized concentration of dopant in titanium oxide. In the case of niobium doped titanium oxide, the optimized concentration of niobium is 4-15%.

Figure 2B:
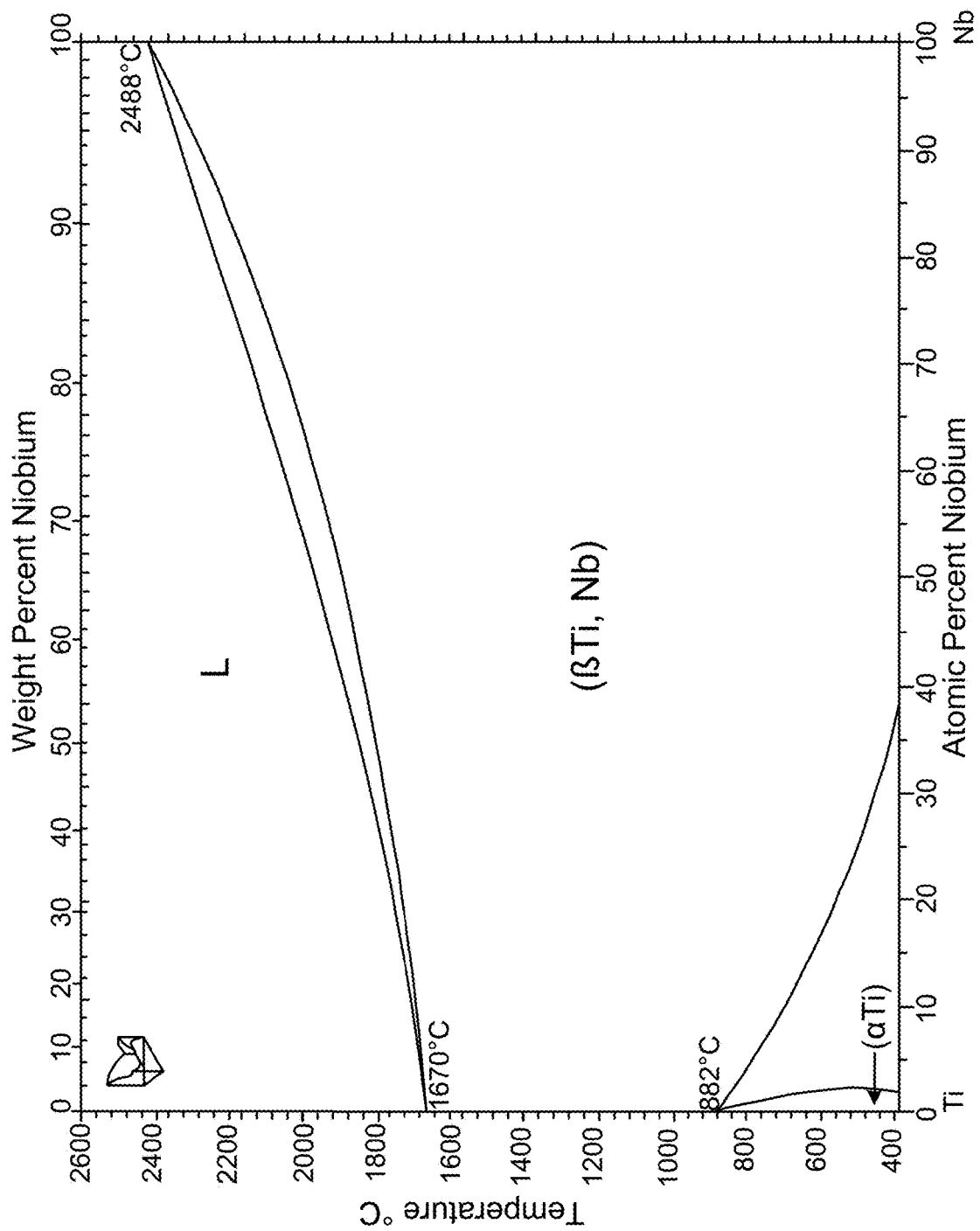
FIG. 2B is the Phase Diagram of Ti—Nb alloy.

FIG. 2B is the phase diagram of a titanium-niobium alloy, as in "Binary Alloy Phase Diagrams", edited by T. B. Masslski, J. L. Murray, L. H. Bennett and H. Baker and published by American Society of Metals in 1986. It shows that the titanium-niobium alloy has a single α-phase at temperature between 400 and 882° C. with the niobium concentration of 0 to 2%. At the niobium concentration above 37%, the alloy will have the single β-phase at 400° C. At the niobium concentration between 2 and 37%, the alloy will be the mixture of low niobium concentration α-phase and the niobium concentration β-phase at 400° C. Although there is no reported data of a titanium-niobium phase diagram at temperatures below 400° C., it is expected that the phase structure will be similar to that at 400° C., except the niobium concentration range for α- and β-phases could be slightly different than that at 400° C. For example, the maximum niobium concentration in α-phase could be in the range of 1-3%, and the minimum niobium concentration in β-phase could be in the range of 35-40% at room temperature.

It is common knowledge that the actual phase structure of the alloy at room temperature is also related to the processing conditions that determine the phase transfer reaction kinetics. In some cases, it is also possible to obtain a single phase structure of the alloy at room temperature at the two-phase structure concentration range.

The doped titanium oxide can be prepared as the oxide ceramic material. It can also grow on a titanium alloy surface in the form of thin surface oxide layer.

The composition of the surface oxide layer is highly related to the surface composition of the metallic substrate. Typically, the metallic surface with a higher niobium concentration will form the titanium oxide surface layer with a higher niobium dopant concentration. For example, the low niobium content α-phase alloy surface will form a low concentration niobium doped titanium oxide surface layer. The high niobium content β-phase alloy will form a high concentration niobium doped titanium oxide surface layer.

In the case of the two-phase Ti—Nb alloy, the composition of the surface oxide is not uniform. The surface oxide layer on the low niobium content α-metallic phase will have a low concentration niobium doped titanium oxide, and the surface oxide layer on the high niobium content β-metallic phase will have a high concentration of niobium mixed with titanium oxide. For example, the surface oxide on α-phase with 2% niobium normally have the composition close to 2% niobium doped titanium oxide, and the surface oxide on β-phase with 40% niobium normally have the composition close to 40% niobium oxide and titanium oxide mixture.

As discussed above, the surface oxide layer on the low niobium content α-phase is semi-conductive, but on the high niobium content (up to 40%) β-phase could be non-conductive because the too high niobium dopant concentration changes the crystal structure of the oxide and results in non-electrical conductive phases. Therefore, it has to control the niobium concentration in the alloy to avoid the resistive phase in the surface oxide layer.

Other Ti alloys, such as Ti—Ta, Ti—V, Ti—Mo and Ti—W have similar limitations in maintaining high dopant element concentration in the α-phase of Ti alloy. Its formulation has to be carefully controlled to avoid resistive phases in the surface oxide layer.

These inherent properties of the titanium alloy and doped titanium oxides are the reasons that limit further lower surface electrical contact resistance in Neil Aukland's work. They can only obtain up to 3% concentration of niobium or tantalum in the titanium alloy to avoid the resistive phase in the surface oxide layer, which cannot provide sufficient dopants in the doped titanium oxide surface layer to achieve the low surface contact resistance for the targeted PEM fuel cell application.

Another type of stable semi-conductive oxide is low element doped niobium pentoxide. For example, +4 valance titanium doped in niobium pentoxide forces some $Nb^{+5}$ ions convert to $Nb^{+4}$ status, which makes the niobium pentoxide more electrically conductive. Similar with doped titanium oxide semiconductor, the doped niobium oxide has to keep the pentoxide crystal structure that has the metal ion to oxygen ratio of 2:5. The most common dopant is titanium oxide. Other low valance metallic elements, such as zirconium, yttrium, hafnium and scandium oxide can also be used.

It is the objective of disclosed embodiments to overcome these limitations by methods that can modify the chemical composition of the surface oxide layer to achieve lower surface electrical contact resistance.

Figure 3:
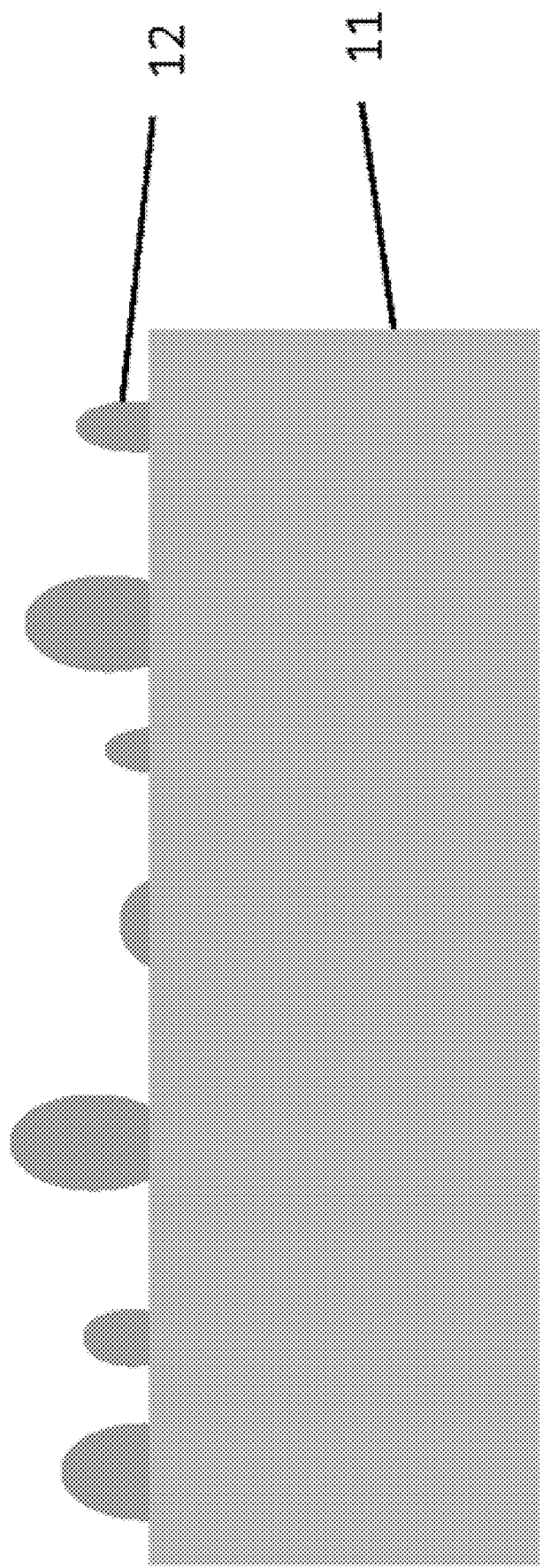
FIG. 3 is a schematic cross-sectional view of a metallic plate surface structure including round top peaks.

FIG. 3 is the schematic cross sectional drawing of a metal surface with peaks on the surface. The peaks have a round shape at the top. Reference numeral 11 is the body of the metallic component as the substrate. Reference numeral 12 is the peaks on the surface of metallic components. The peaks 12 could have the same material as the metallic body 11, or different materials.

Figure 4:
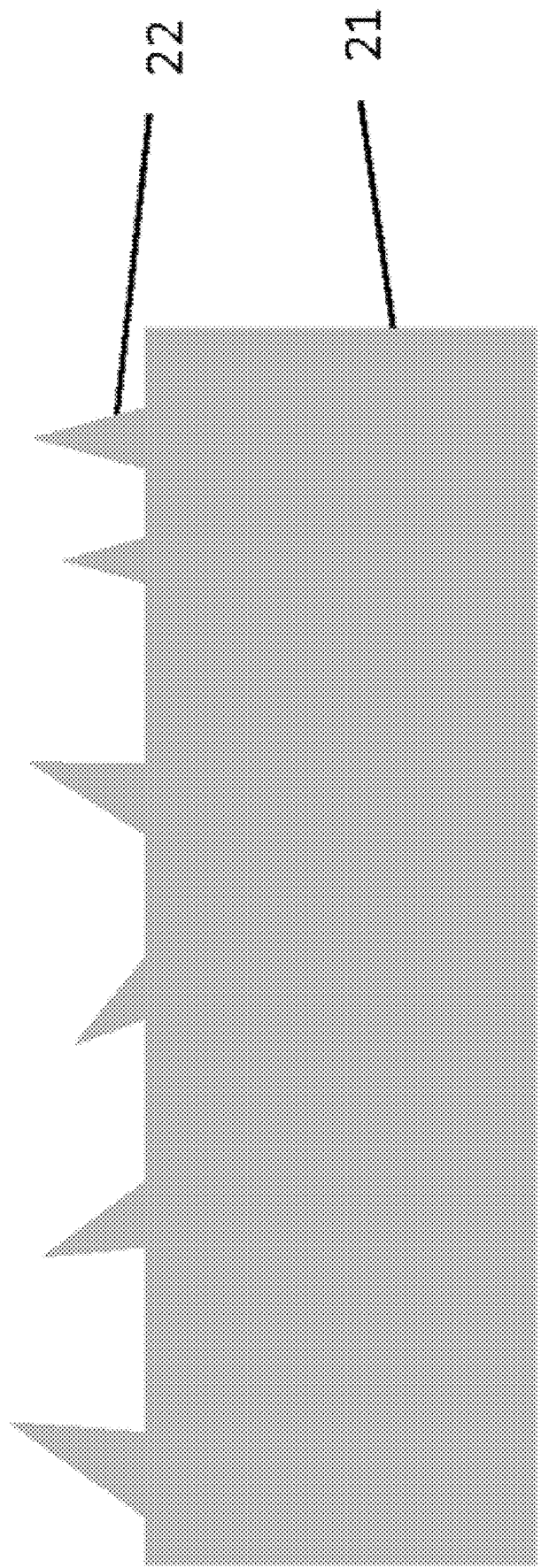
FIG. 4 is a schematic cross-sectional view of a metallic plate surface structure including sharp top peaks.

FIG. 4 is the schematic cross sectional drawing of the metal surface with peaks on the surface. The peaks have a sharp, spiky shape at the top. Reference numeral 21 is the body of the metallic component. Reference numeral 22 are the peaks on the surface of metallic components. The peaks 22 could have the same material as the metallic body 21, or different materials.

In one embodiment disclosed herein, the surface of a metallic component is modified to have small peaks. The small peaks create many high-pressure contacting points and actual contacting areas with other solid components. In some embodiments, the small peaks will have elastic or plastic deformation under the high contacting pressure that result in a high surface contact area with the components in contact, and the low electrical contact resistance. In these embodiments, the small peaks behave like the soft contact material in previous art. But the softness is achieved by the small dimension, instead of the material's inherent properties, like gold and tin. In some embodiments, the peaks can pin through the high resistive surface layer of the component in contact, with high-pressure on the contacting points to establish a low resistance contact The peaks could have a round or irregular shape with the diameter between 10 nm to 10 microns. They can point straight up from the surface, or point sideways. It also could have a shape of thin sheet with the thickness between 5 nm to 5 microns. The height of the peaks is between 10 nm to 10 microns. The distribution density (the total amount of peaks in one $cm^2$ area) of the peaks is between 0.5 million/$cm^2$ and 5 billion/$cm^2$. The top of the peaks could have a round shape as illustrated in FIG. 3, or sharp shape as illustrated in FIG. 4. In some embodiments, the peaks have a diameter or width in a range of 5 nm-10 nm, 5 nm-100 nm, 50 nm-500 nm, 10 nm-20 μm, 5 nm-0.5 μm, 20 nm-1 μm, 100 nm-0.9 μm, 20 nm-5 μm, 100 nm-2 μm, 0.5 μm-5 μm, or 1 μm-10 μm. In some embodiments, the peaks may have a height in a range of 10 nm-100 nm, 50 nm-500 nm, 10 nm-10 μm, 50 nm-0.5 μm, 20 nm-1 μm, 100 nm-0.9 μm, 20 nm-5 μm, 100 nm-10 μm, 0.5 μm-5 μm, or 1 μm-10 μm. In some embodiments, the distribution density of the peaks is in a range of 0.5-100 million/$cm^2$, 1-200 million/$cm^2$, 5-200 million/$cm^2$, 5-500 million/$cm^2$, 10 million-1 billion/$cm^2$, 20 million-2 billion/$cm^2$, 50 million-5 billion/$cm^2$, 100 million-5 billion/$cm^2$.

In one embodiment, the metal substrate 11 surface is coated with another material (not shown in FIG. 3) for better corrosion resistance and electrical conductance. The peaks 12 could be the same or different material as the coating material. The thickness of this coating material is between 5 nm to 5 μm. In some embodiments, the thickness of the coating is between 5-20 nm, 10-50 nm, 20-200 nm, 50-500 nm, 0.1-0.5 μm, 0.2-1 μm, 0.5-2 μm, 1-5 μm, and 2-5 μm.

In one embodiment, the metal substrate 11 surface is modified to have a micro-textured surface structure, then the micro-textured metal substrate is coated with another material (not shown in FIG. 3) for better corrosion resistance and electrical conductance. The thickness of this coating material is between 5 nm to 5 μm. In some embodiments, the thickness of the coating is between 5-20 nm, 10-50 nm, 20-200 nm, 50-500 nm, 0.1-0.5 μm, 0.2-1 μm, 0.5-2 μm, 1-5 μm, and 2-5 μm.

In one embodiment, the surface of the metallic component is modified to have small pits on the surface. These pits have sharp edges that perform as high pressure points to reduce electrical contact resistance when they are in contact with other components. The pits can have round or irregular shapes with a diameter between 5 nm to 20 microns. The pits can also have narrow gap shapes that have a width between 10 nm to 10 microns. The depth of the pits is 50 nm to 10 microns. The distribution density of the pits is between 0.5 million/$cm^2$ and 5 billion/$cm^2$. In some embodiments, the pits have a diameter or width in a range of 5 nm-10 nm, 5 nm-100 nm, 50 nm-500 nm, 10 nm-20 μm, 5 nm-0.5 μm, 20 nm-1 μm, 100 nm-0.9 μm, 20 nm-5 μm, 100 nm-2 μm, 0.5 μm-5 μm, 1 μm-10 μm or 5 μm-20 μm. In some embodiments, the pits have a depth in a range of 50 nm-500 nm, 50 nm-10 μm, 70 nm-0.5 μm, 70 nm-1 μm, 100 nm-0.9 μm, 100 nm-5 μm, 100 nm-10 μm, 0.5 μm-5 μm, or 1 μm-10 μm. In some embodiments, the distribution density of the pits is in a range of 0.5-100 million/$cm^2$, 1-200 million/$cm^2$, 5-500 million/$cm^2$, 5-500 million/$cm^2$, 10 million-1 billion/$cm^2$, 20 million-2 billion/$cm^2$, 50 million-5 billion/$cm^2$, 100 million-5 billion/$cm^2$.

Figure 5:
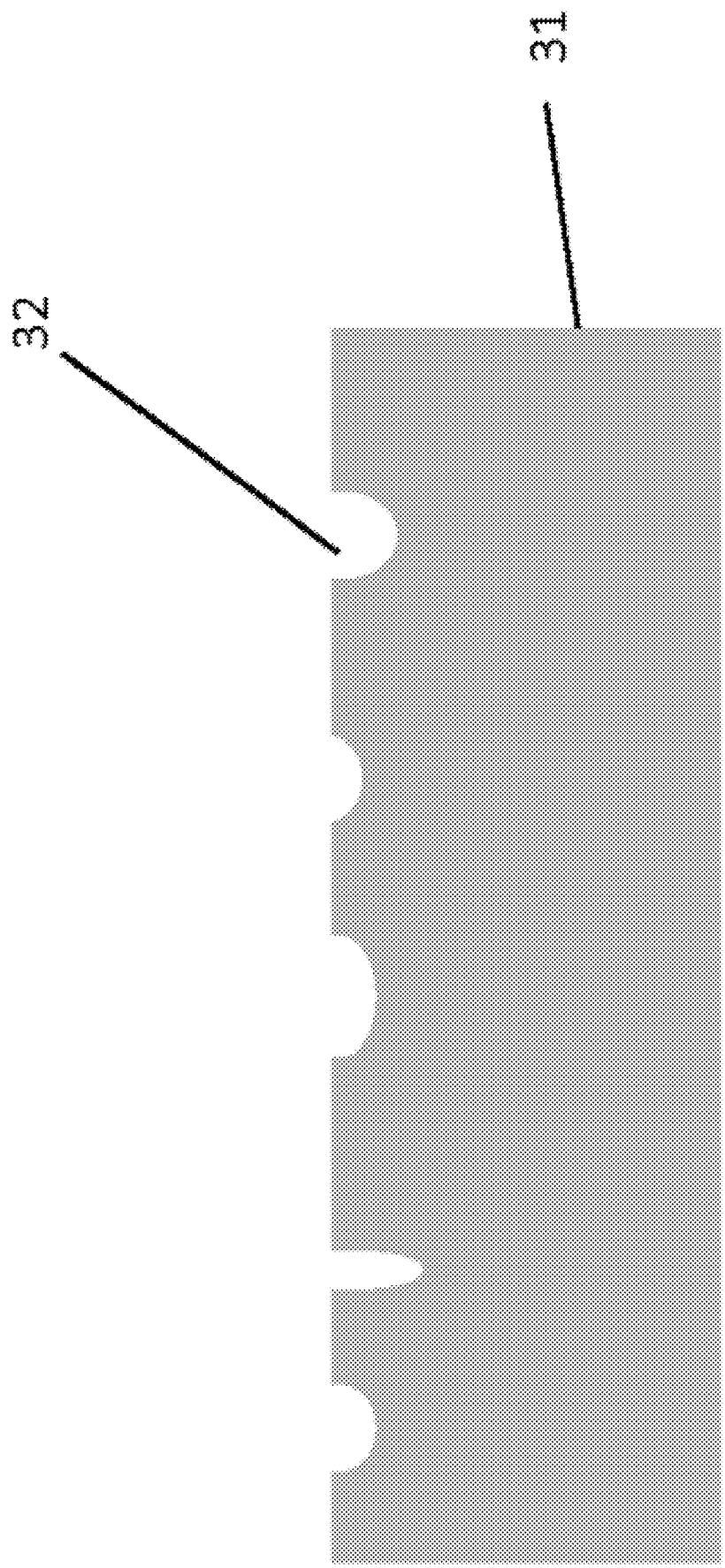
FIG. 5 is a schematic cross-sectional view of a metallic plate surface structure including valleys and pits.

FIG. 5 is the schematic cross section drawing of the metal surface with pits 32 on the surface of a metallic component 31.

In one embodiment, the metallic component surface has both peaks and pits as illustrated in FIGS. 3-5. The dimensions and distribution of peaks and pits are the same as those described in the first embodiment described above.

In one embodiment, a low alloy element concentration, single phase titanium alloy substrate or the titanium alloy coating is prepared. Then, the alloy surface is chemically etched to remove the original surface oxide layer. With the proper control of the etching condition, the etched surface has a higher alloy element concentration than the bulk of the alloy, due to the different etching rate of titanium and the alloy element. The difference in the etching rate between titanium and alloy elements is determined by the etchant concentration, etching time, etching temperature. At low etchant concentration and short etching time, difference of titanium etching and alloy element etching may be too small to enrich alloy elements in the surface oxide layer. In order to obtain the alloy element enriched surface layer, the etching should be performed in the condition of sufficient etchant concentration and etching time. At room temperature, the etched surface with the high alloy element concretion is still in the original single phase structure, due to the kinetic limitation of phase transfer at room temperature. A thin oxide surface layer, then, naturally and rapidly forms on the etched titanium alloy surface with higher alloy element (dopant) concentration. The oxide surface layer on the etched titanium alloy surface has high dopant concentration than that formed on the original titanium alloy surface. The higher dopant concentration can increase the electrically conductive surface oxide layer and reduce the surface electrical contact resistance of the alloy with other components.

In one embodiment, a low alloy element concentration, single phase titanium alloy or the alloy coating is prepared. Then, the alloy surface is heated up to high temperature. The alloy elements could diffuse and accumulate on the surface oxide layer resulting in a high dopant concentration surface oxide layer. The heat treatment temperature is between 100-800° C. for 10 seconds to 1 hours. In some embodiments, the oxidization temperature is between 100-300° C., 250-400° C., 400-600° C., 550-700° C., 500-800° C. In some embodiments, the heat treatment time is 10 seconds to 1 minutes, 30 seconds to 5 minutes, 1 minutes to 20 minutes, 10 minutes to 1 hour. In one embodiment, the alloy element is niobium or tantalum.

The alloy element is a high valance metallic element, including Nb, Ta, V, Mo, W. The concentration of the high valance element in the titanium alloy is between 0.01 and 3%, in a binary Ti alloy to maintain the single α-phase structure. In some embodiments, the concentration of the high valance elements in the titanium is in a range of 0.01-0.1%, 0.01-0.5%, 0.1-1%, 0.2-1%, 0.5-1%, 0.2-2.5%, 0.5-3%, 1-2% and 1-3%. In some embodiments with the titanium alloy containing more than one alloy element, high valance elements must be included, and the composition of the alloy has to be selected to maintain the single phase structure, and the total alloy elements' concentration should be less than 30%. In some embodiments, the total alloy element concentration is in the rage of 0.1-1%, 0.5-2%, 0.5-5%, 1-8%, 1-10%, 2-15%, 5-20%, 1-30%, 5-30% and 10-30%.

The concentration of the high valance element in the surface oxide layer of the binary alloy is 3-25%. In some embodiments, the high valance element concentration in the surface oxide layer is in the rage of 3-5%, 3-8%, 4-10%, 5-10%, 5-15%, 5-15%, 7-20%, 7-25%, 10-25% and 15-25%. In some embodiments of the etched surface oxide layer containing more than one alloy element, the concentration of the high valance ($M^{+5}$, $M^{+6}$, $M^{+7}$) elements must be high enough to compensate for the low valance ($M^{+3}$, $M^{+2}M^{+1}$) elements, and maintain the weighted average valance of metallic elements in the surface oxide in the range of +4.02 to +4.25. In some embodiments, the weighted average valance is in the range of +4.02 to +4.05, +4.02 to +4.10, +4.03 to +4.20, +4.05 to +4.10, +4.05 to +4.15, +4.05 to +4.20, +4.07 to +4.15, +4.10 to +4.20, +4.15 to +4.20 and +4.15 to +4.25.

The composition of the surface oxide layer on the titanium alloy surface can be tailored by the composition of the initial titanium alloy, the etching method, etchant composition and etching conditions (temperature, concentration, etching time, etc.).

The etching method includes the wet chemical etching, electrochemical etching, plasma enhanced reactive ion etching, vapor etching or other dry etching processes. In plasma etching process, the etchant is fluorine or chlorine radicals that is be generated from fluorine or chlorine containing compounds under plasma. The radical concentration is significant higher at high plasma power. The etched titanium alloy surface will naturally grow a new oxide surface layer, as soon as it is in contact with oxygen or water, due to the high activity of titanium with oxygen.

The electrochemical stability of the semi-conductive doped titanium oxide surface layer on the titanium alloy can be enhanced by increasing the surface oxide thickness with controlled surface oxidization processes, such as thermal oxidization, plasma oxidization, wet chemical oxidization and anodizing. The thicker oxide layer increases the initial surface electrical contact resistance of the alloy, but makes it more stable in the operational environment of electrochemical devices. The thermal oxidation temperature is between 100-800° C. In some embodiments, it is in the range of 100-200° C., 100-400° C., 200-450° C., 200-500° C., 300-500° C., 400-600° C. and 500-800° C.

In another embodiment, a low cost metal is used as the substrate material of the metallic components in electrochemical devices. A titanium alloy is coated on the low cost metallic substrate surface to improve the corrosion resistance and reduce the surface electrical contact resistance of the substrate metal. The titanium alloy contains high valance alloy elements and has a single phase structure after it is coated on the substrate surface. The phase could be α-phase, β-phase or amorphous phase. For the titanium alloy coating material that is not in the single phase at room temperature, the coating process has to rapidly quench the coating alloy from high temperature to freeze the high temperature single phase to low temperature during the coating process. The suitable coating process includes thermal spray and cathodic arc deposition. The titanium alloy coating surface will form a semi-conductive surface oxide surface layer that has low surface electrical contact resistance and enhance the corrosion resistance of the low cost metallic substrate material. The alloy element is a high valance metallic element, including Nb, Ta, V, Mo, W. The concentration of the high valance element in the titanium alloy is between 0.01 and 20%, in a binary Ti alloy to maintain the single phase coating. In the case of titanium alloy containing more than one alloy element, high valance elements must be included, and the total alloy element concentration is between 0.01 and 40%. In some embodiments, the total alloy elements concentration is in the range of 0.01-0.2%, 0.1-1%, 0.5-2%, 0.5-5%, 1-8%, 1-10%, 1-30%, 1-40%, 2-15%, 5-20%, 5-30%, 5-40%, 15-30%, 10-30%, 10-40%.

In some embodiments, the surface electrical contact resistance of the titanium alloy coated surface could be further reduced by chemically etching to tailor the surface composition in the way that the surface oxide layer has the optimized composition and morphology for the lowest surface electrical contact resistance. The etched titanium alloy coating surface forms the doped titanium oxide surface layer. For the coating of the binary titanium alloy with the high valance alloy element, the dopant concentration in the surface oxide layer is 3-15%. In some embodiments, the high valance element concentration in the surface oxide layer is in the rage of 3-5%, 3-8%, 4-10%, 5-10% and 5-15%. For the coating of multi elements alloy, the concentration of the high valance ($M^{+5}$, $M^{+6}$, $M^{+7}$) elements in the surface oxide layer must be high enough to compensate for the low valance ($M^{+3}$, $M^{+2}$, $M^{+1}$) elements in the surface oxide layer, and maintain the weighted average valance of metallic elements in the surface oxide in the range of +4.02 to +4.25. In some embodiments, the weighted average valance is in the range of +4.02 to +4.05, +4.02 to +4.10, +4.03 to +4.20, +4.05 to +4.10, +4.05 to +4.15, +4.05 to +4.20, +4.07 to +4.15, +4.10 to +4.20, +4.15 to +4.20 and +4.15 to +4.25.

The electrochemical stability of the semi-conductive doped titanium oxide surface layer on the titanium alloy coating can be enhanced by increase the surface oxide thickness with controlled surface oxidization processes, such as thermal oxidization, plasma oxidization, wet chemical oxidization and anodizing. The thicker oxide layer increases the initial surface electrical contact resistance of the alloy, but makes it more stable in operation environment of electrochemical devices. The thermal oxidation temperature is between 100-800° C. In some embodiments, it is in the range of 100-200° C., 100-400° C., 200-450° C., 200-500° C., 300-500° C., 400-600° C. and 500-800° C.

The low cost substrate material may be one of iron, chromium, nickel, cobalt, manganese, aluminum and alloys containing these elements. Examples of the substrate are commercial pure titanium, 316L stainless steel and 6061 aluminum alloy.

The Ti alloy coating thickness is between 0.01 μm and 100 μm, preferred between 0.05 μm and 5 μm. In some embodiment, the thickness of the titanium alloy coating is in the rage of 0.01 μm-0.05 μm, 0.01 μm-0.1 μm, 0.05 μm-0.2 μm, 0.05 μm-0.5 μm, 0.1-0.5 μm, 0.1 μm-1 μm, 0.5 μm-3 μm, 0.5-5 μm, 0.5 μm-10 μm, 1 μm-10 μm, 0.5 μm-50 μm, 1-50 μm, 5-50 μm, 5-100 μm and 10 μm-100 μm.

The deposition method for the titanium alloy coating includes physical vapor deposition (PVD) and a thermal spray process.

The composition of the etched titanium alloy coating surface layer can be tailored by the composition of the initial titanium alloy, the etching method, etchant composition and etching conditions (temperature, concentration, etching time, etc.) and thermal oxidization. The etching method includes wet chemical etching, electrochemical etching, plasma enhanced reactive ion etching, vapor etching or other dry etching processes.

The surface electrical contact resistance of the coated plates can be further reduced by the modification of the surface morphology to the way the surface is constructed with the small peaks and pits. The dimensions and distribution of peaks and pits are same as those described above.

The peaks and pits on the micro-structured surface can be formed by either removing materials from metallic substrate surface or adding materials onto metallic substrate surface, such as by chemically etching the Ti alloy coated metallic substrate, or depositing the Ti alloy coating on the substrate surface. The treatment process to obtain the micro-textured surface structure also includes cold rolling, sand blasting, water jet blasting, laser engraving and depositing other materials to build the peaks on the surface. The deposition method could be PVD, thermal spray, electrical plating and other additive manufacture processes.

Typical metallic plates are produced by a multi-step rolling and stress release heat treatment. As the result, the grain of the polycrystalline structure is fairly large, such as 10-100 μm in diameter. The etching of this type of material will only obtain large size (>10 μm) peaks and pits that cannot sufficiently reduce the metal plate surface electrical contact resistance. In one embodiment, the grain size of the metallic component or its surface layer is reduced to <10 μm, or even <1 μm. Then, a chemical etching method can be used to remove some grains from the surface to obtain the desired micro-texture surface structure, described above, having low electrical contact resistance.

The grain size reduction can be achieved by a rapid melting and solidification of the metal substrate surface to obtain the amorphous or nano-crystalized structure of the surface layer. The thickness of the re-crystalized layer is 0.5-20 μm. A heat treatment step is then used to obtain the designated grain size. In general, a higher heat treatment temperature and a longer treatment time will lead to larger grain size. For the typical stainless steel and titanium alloys, the heat treatment temperature is between 800-1200° C., and the heat treatment time is 0.5-5 hours.

The grain size of the surface layer can also be obtained by deposit a coating material at temperature below 800° C. The low deposition temperature will ensure the small grain size of the coating layer. In one embodiment, a physical vapor deposition process is used to deposit the coating material on the metal substrate surface. The typical grain size of the coating layer is less than 1 μm.

In one embodiment, the metallic substrate is produced by a rapid solidification process, such as melt spinning, to obtain the amorphous or nano-crystalized structure. A heat treatment step is then used to obtain the designated grain size of the metal substrate. In general, a higher heat treatment temperature and a longer treatment time will lead to larger grain size. For typical stainless steel and titanium alloys, the heat treatment temperature is between 800-1200° C., and the heat treatment time is 0.5-5 hours.

The electrochemical stability of the semi-conductive doped titanium oxide surface layer on the titanium alloy coating can be enhanced by increasing the surface oxide thickness with controlled surface oxidization processes, such as thermal oxidization, plasma oxidization, wet chemical oxidization and anodizing. The thicker oxide layer increases the initial surface electrical contact resistance of the alloy, but it makes the oxide layer more stable in the operational environment of electrochemical devices. The thermal oxidation temperature is between 100-800° C. In some embodiments, it is in the range of 100-200° C., 100-400° C., 200-450° C., 200-500° C., 300-500° C., 400-600° C. and 500-800° C.

In one embodiment, a niobium alloy is used as the coating material on a low cost metal substrate, such as stainless steel or aluminum. The niobium alloy contains low valance alloy elements, such as titanium, zirconium, hafnium, yttrium, scandium, aluminum. The concentration of these alloy elements in a niobium alloy is between 1 and 25%. After the niobium alloy is coated on the low cost metal substrate, a doped niobium pentoxide surface layer is formed on the surface. The doped niobium pentoxide surface layer can be formed by natural oxidization in air at room temperature, or enhanced oxidization by anodizing, wet chemistry oxidization with oxidizers such as nitric acid or hydrogen peroxide, thermal oxidization or plasma oxidization. The semi-conductive doped niobium pentoxide surface layer can keep the low electrical surface contact resistance of metallic components for electrochemical applications. In some embodiments, the dopant element concentration in the niobium alloy coating material is in the rage of 1-5%, 1-10%, 1-15%, 2-15%, 2-20%, 3-30%, 5-20%, 5-25%, and 10-25%. The thermal oxidation temperature is between 100-600° C. In some embodiments, it is in the range of 100-200° C., 100-400° C., 200-450° C., 200-500° C., 300-500° C., 400-600° C. and 500-800° C.

The niobium alloy coating layer is between 0.01-10 microns thick. In some embodiments, the thickness of the niobium alloy coating is in the rage of 0.01 μm-0.05 μm, 0.01 μm-0.1 μm, 0.05 μm-0.2 μm, 0.05 μm-0.5 μm, 0.1 μm-0.5 μm, 0.1 μm-1 μm, 0.5 μm-3 μm, 0.5 μm-5 μm, 0.5 μm-10 μm and 1 μm-10 μm.

Example 1

A commercial pure titanium foil was selected for the surface modification to achieve the low electrical surface contact resistance. A 3 cm×5 cm titanium foil was soaked in 50 ml 1.5 wt % hydrofluoric acid solution for about 2 hours at room temperature. At first, the hydrofluoric acid etched off the native oxide surface layer of titanium. Then, it continually etched the metallic portion of titanium foil. During the etching process, hydrofluoric acid was consumed; its concentration was continually decreased and the etching rate of titanium in the depleted hydrofluoric acid solution was reduced.

Figure 6:
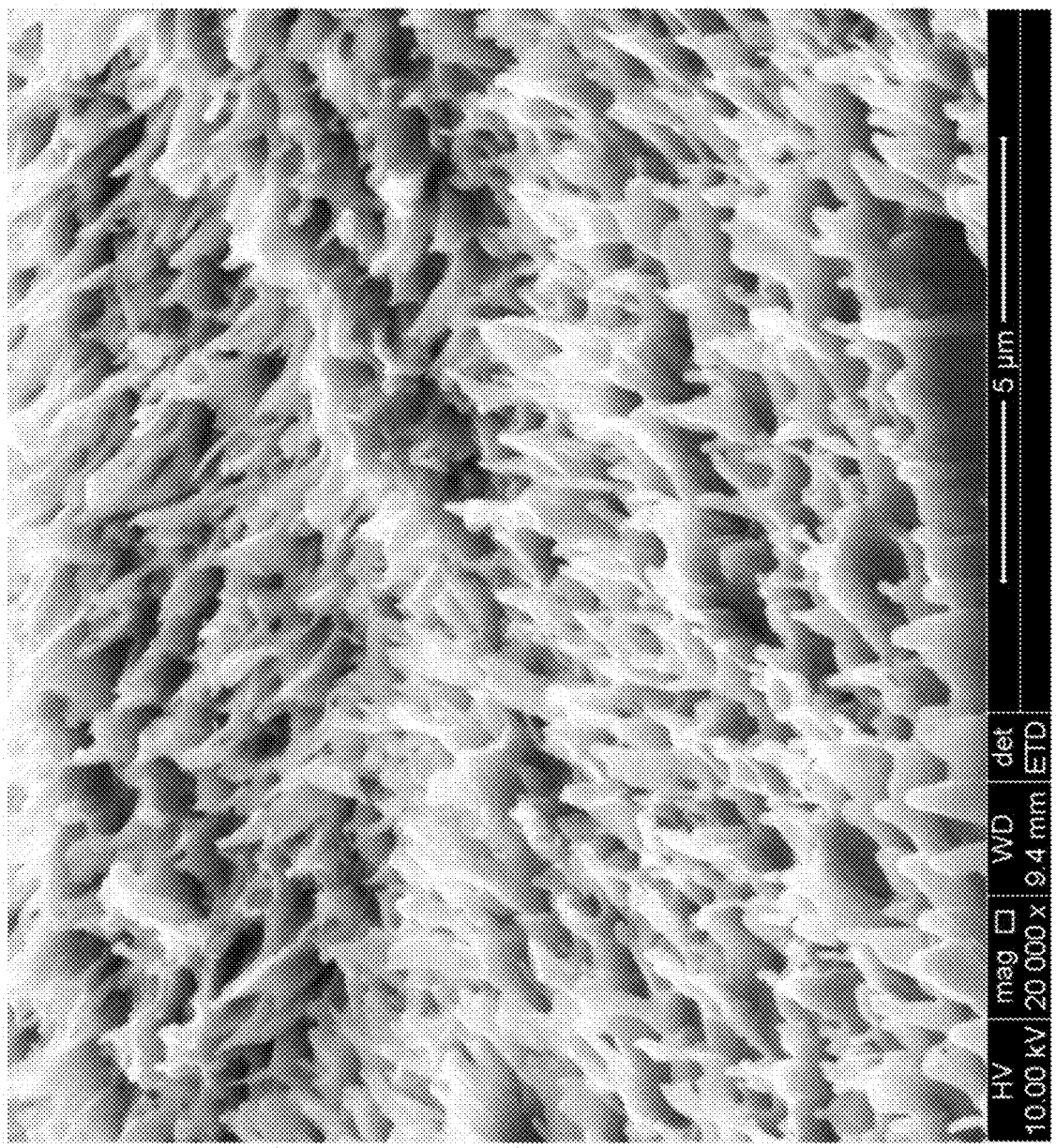
FIG. 6 is a SEM picture of a titanium foil surface at a 52° viewing angle, according to an embodiment. The surface includes many small peaks that have sharp tops.

The etching process converted the morphology of the flat titanium surface to small peaks. FIG. 6 is a SEM picture of the etched titanium surface at a 52° viewing angle. It includes large amount of small peaks that have a sharp top. Some of the peaks are in a thin sheet shape that has the width between 50-100 nm. Some peaks has the diameter of 50-100 nm. The height of the peaks is between 50 nm and 1 micron. The distribution density of the peaks is estimated to be close to 1 billion/cm$^2$.

In order to stabilize the surface oxide layer, the etched titanium foil was thermally oxidized in air at 450° C. for 1 hour. The through plate resistance (TPR) of the titanium foil was measured with two pieces of carbon felt (TGP-H-060 Toray Paper). Table 1 summarizes the TPR of the etched titanium foil and the TPR of the original titanium foil after 450° C. thermal oxidization. The table shows that the TPR of the etched titanium is 18.1 mΩ·cm$^2$ at 150 psi. In comparison, the original titanium foil has a TPR of 1.04 Ω·cm$^2$ at 150 psi, which is about 58 times higher than the titanium foil with the modified surface morphology by etching.

TABLE 1

Electrical through plate resistance of original titanium and etched titanium after 450° C. thermally oxidized

| | Through Plate Resistance (mΩ · cm$^2$) | |
|---|---|---|
| Origianl | Original Ti | Etched Ti |
| 35 | 1953.05 | 62.28 |
| 51 | 1840.82 | 50.51 |
| 91 | 1153.42 | 29.00 |
| 150 | 1038.69 | 18.10 |
| 201 | 960.69 | 14.25 |

TABLE 1-continued

Electrical through plate resistance of original titanium
and etched titanium after 450° C. thermally oxidized

| | Through Plate Resistance (mΩ · cm$^2$) | |
|---|---|---|
| Origianl | Original Ti | Etched Ti |
| 251 | 892.13 | 11.87 |
| 300 | 836.81 | 10.31 |

The etched titanium surface was superhydrophilic. The foil was much softer and more flexible than the original cold rolled foil due to the removal of the high stress surface layer. The superhydrophilic surface property has additional advantages for water management in fuel cell and electrolyzer stacks. The high flexibility of the foil may have the benefit of being more easily conformed in the electrolyzer stacks for the optimized stack sealing and integration.

Example 2

Figure 7:
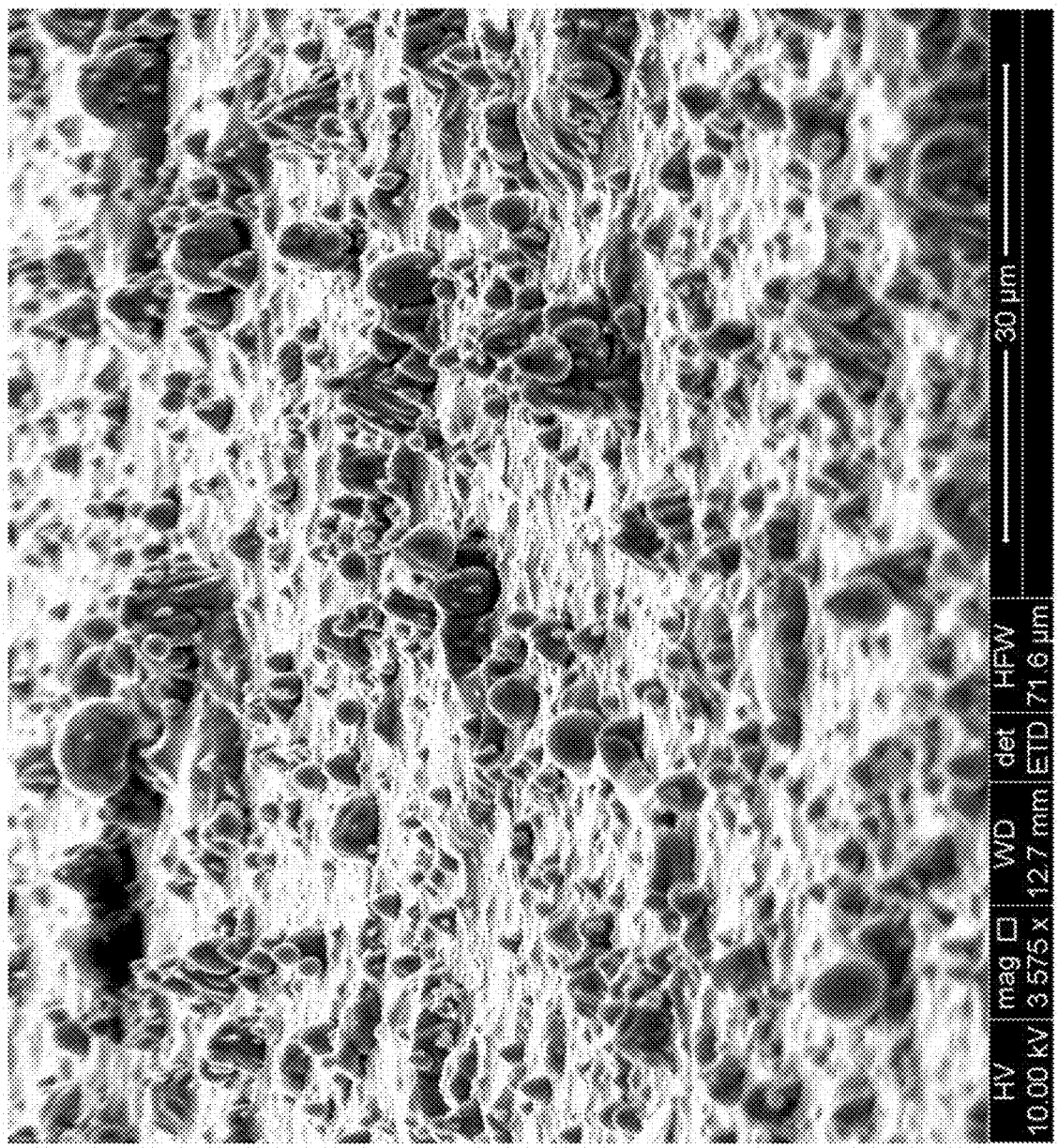
FIG. 7 is a SEM picture of a titanium coated 316 L stainless steel foil surface at a 52° viewing angle, according to an embodiment. The surface includes many small round titanium peaks.

A 316L stainless steel foil was used as the substrate. Commercial pure titanium was deposited on the surface by a cathodic arc process (CA-Ti-SS). Cathodic arc is an industrial coating process that can melt titanium target surface and blast melted titanium droplets to the substrate, along with titanium vapor. The titanium vapor and droplets are deposited on the stainless steel substrate surface. The vapor coats the stainless steel surface with titanium and the droplets forms small round titanium peaks on the coated surface. FIG. 7 is a SEM picture at a 52° viewing angle of the 316L stainless steel foil with large amount of round titanium peaks. The thickness of the Ti coating on stainless steel is 0.5-2 μm. The diameter of the peaks is between 0.5 and 10 microns. The height of the peaks is between 0.5 and 15 microns. The distribution density of the peaks is estimated of 1-10 million/cm$^2$.

Figure 10:
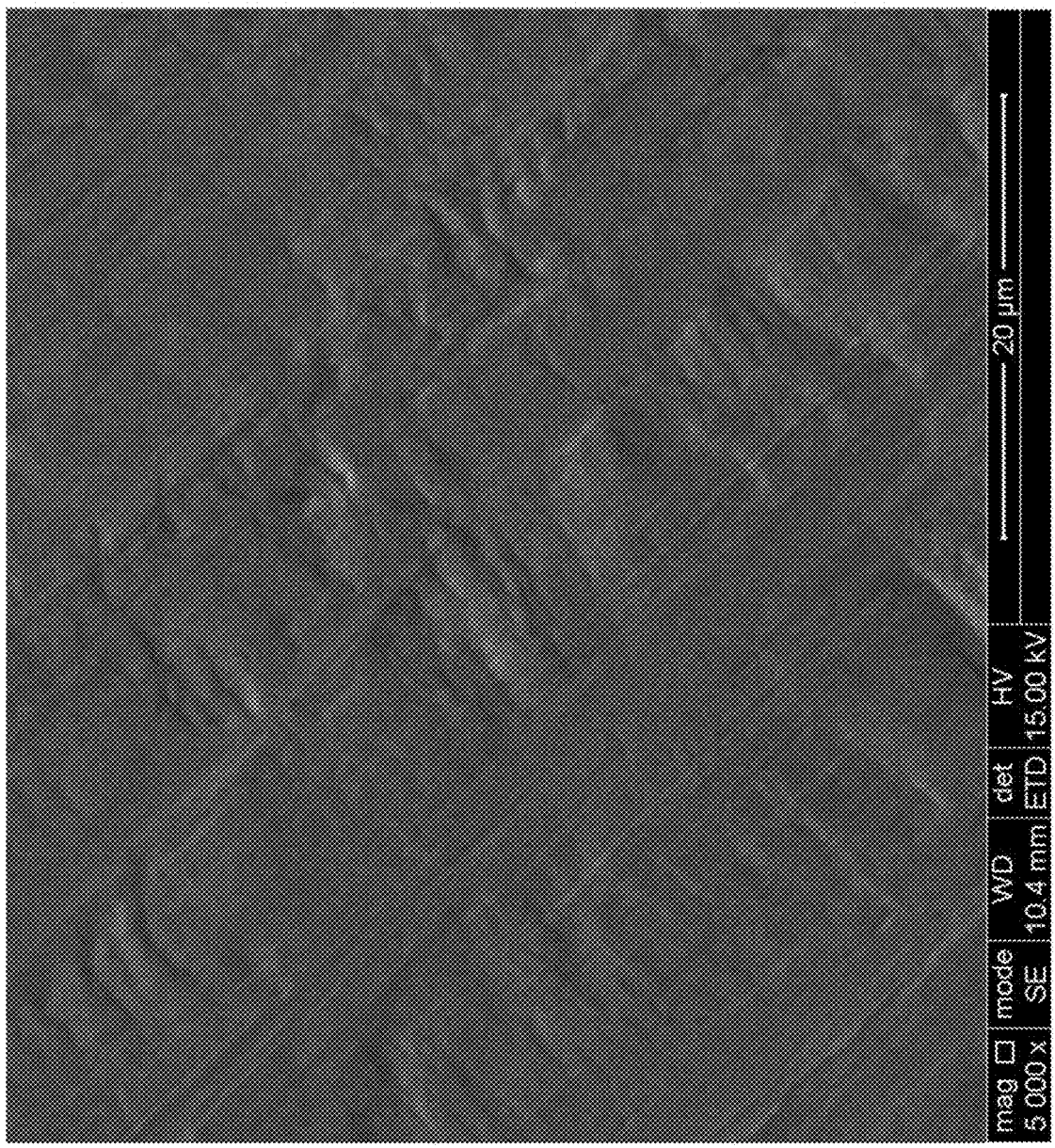
FIG. 10 is a SEM picture of a sputtered titanium coated 316 L stainless steel foil, according to an embodiment.

In comparison, the 316L stainless steel foil was also coated with titanium by DC magnetron sputtering process (SP-Ti-SS). The sputtering process is capable of depositing a relatively flat coating on the substrate surface. FIG. 10 is a SEM picture of the 316L stainless steel foil with sputtered titanium on the surface. The finished surface maintains the original morphology of the cold rolled stainless steel foil without large amount of peaks and pits.

Figure 8:
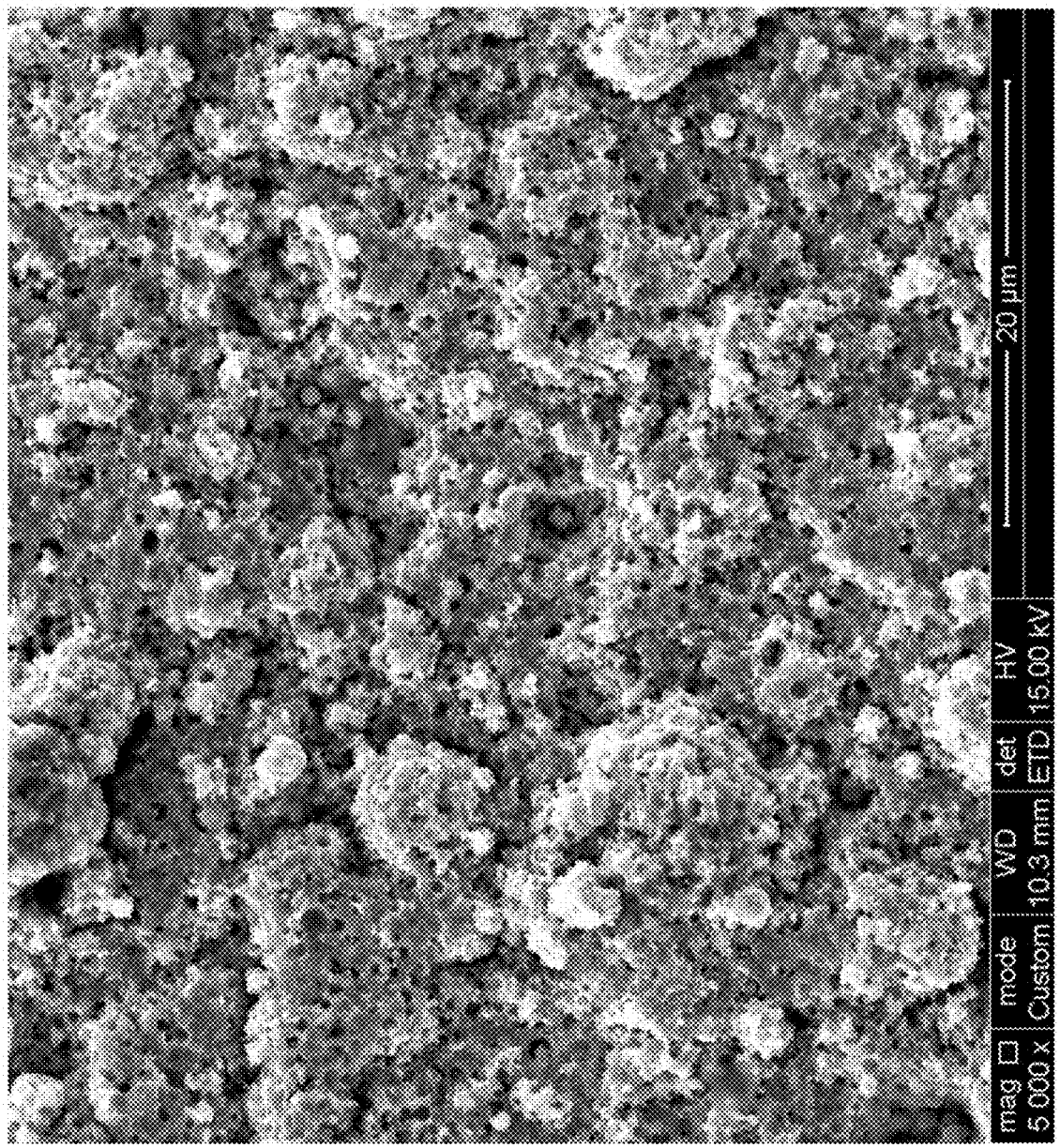
FIG. 8 is a SEM picture of a hydrofluoric acid etched titanium coated 316 L stainless steel foil at 5,000× magnifications, according to an embodiment.
Figure 9:
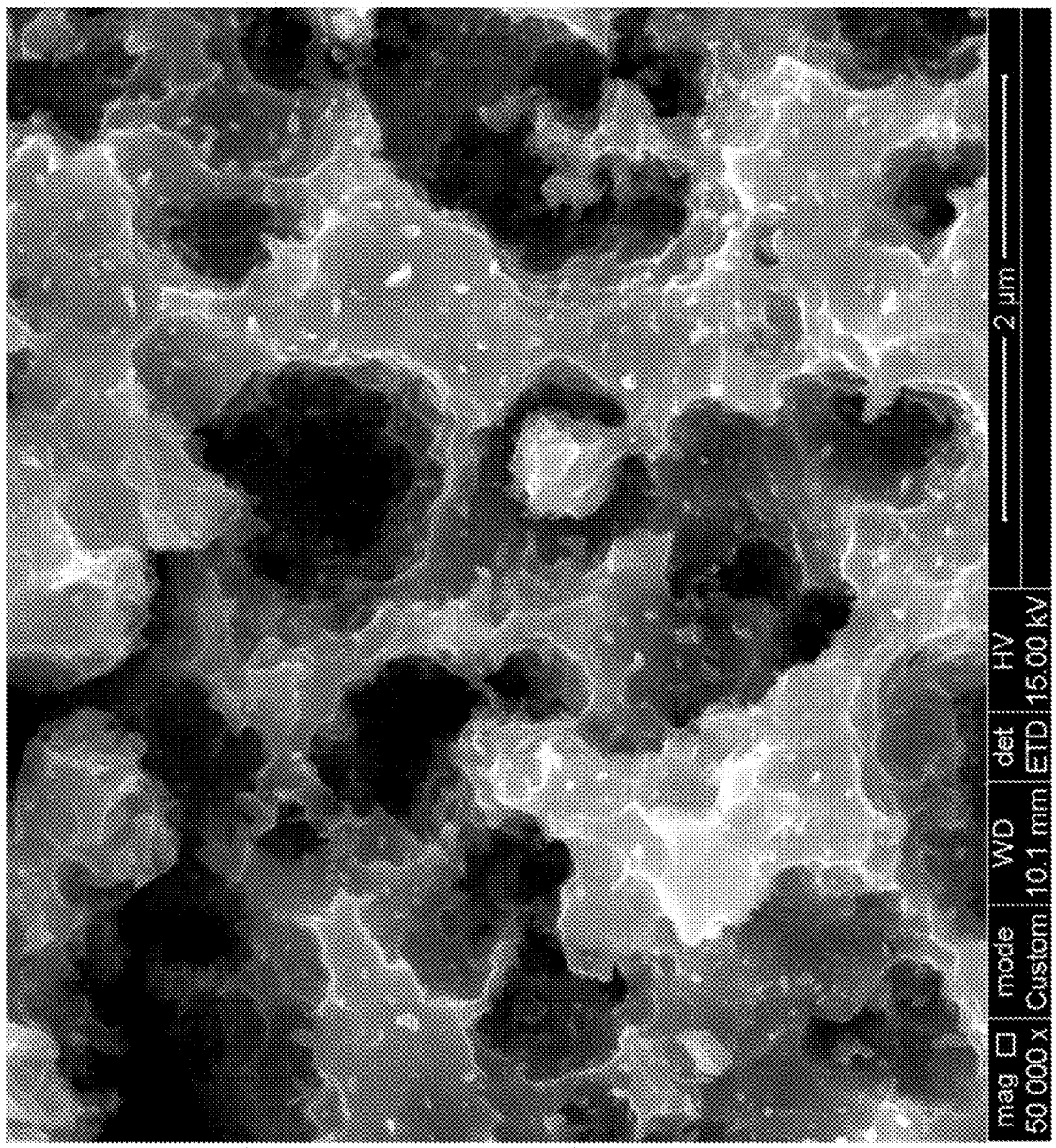
FIG. 9 is a SEM picture of a hydrofluoric acid etched titanium coated 316 L stainless steel foil at 50,000× magnifications, according to an embodiment.

Further modification of the titanium coated stainless steel foil surface was conducted with hydrofluoric acid etching. The titanium coated stainless steel foil was soaked in 2 wt % hydrofluoric acid solution for 30 seconds (Etched CA-Ti-SS or etched SP-Ti-SS). FIGS. 8 and 9 are SEM pictures of the etched titanium coated stainless steel foil surface at 5,000× (for Etched CA-Ti-SS) and 50,000× (for Etched SP-Ti-SS) magnifications, respectively. The etching process produced many pits in the titanium coating layer, in both round peaks and the flat surface at the bottom of the peaks. The pits have sharp edges. The diameter of the pits is between 0.5 and 10 microns. The distribution density of the pits is estimated to be about 10-1,000 million/cm$^2$.

The surface property of the titanium coated stainless steel foil was characterized with the surface electrical contact resistance (CR) of the stainless steel foil with two pieces of carbon felt (TGP-H-060 Toray Paper) under the compression pressure range of 35-300 psi. Table 2 summarizes the results. Table 2 shows that CA-Ti-SS, with the small round peaks has lower CR than that of relatively flat SP-Ti-SS. Etched CA-Ti-SS and SP-Ti-SS with the additional pits have a lower TPR than that of as coated foils.

TABLE 2

Electrical through plate resistance of
titanium coated stainless steel foil.

| | Electrical Contact Resistance (mΩ · cm$^2$) | | | |
|---|---|---|---|---|
| Compression Pressure (PSI) | SP-Ti-SS | CA-Ti-SS | Etched CA-Ti-SS | Etched SP-Ti-SS |
| 35 | 224.35 | 32.80 | 6.20 | 4.93 |
| 51 | 165.19 | 23.31 | 4.27 | 3.93 |
| 91 | 90.41 | 12.51 | 2.29 | 2.16 |
| 150 | 52.97 | 7.49 | 1.41 | 1.29 |
| 201 | 37.35 | 5.60 | 1.08 | 0.98 |
| 251 | 27.92 | 4.47 | 0.89 | 0.79 |
| 300 | 22.29 | 3.77 | 0.78 | 0.70 |

The etched titanium coated SS surface was superhydrophilic which, has the additional advantage for water management in fuel cell stacks. The low surface resistance surface modified titanium coated stainless steel in this example can be used as the bipolar plate material for PEM fuel cells.

Example 3

A titanium-tantalum binary alloy with a tantalum concentration of 2% (Ti-2Ta) was prepared. The alloy surface was grinded with #320 sandpaper (grinded Ti-2Ta). Another piece of the #320 sandpaper grinded Ti-2Ta alloy was chemically etched in 2 wt % hydrofluoric acid solution for 2 minutes (etched Ti-2Ta). It is expected that the surface layer composition of the grinded Ti-2Ta is the same as the bulk (2% Ta), and the etched Ti-2Ta has high Ta concentration in the surface layer due to the faster etching rate of Ti than that of Ta in the condition. Naturally, fresh Ti-2Ta alloy will grow a thin layer of Ta doped titanium oxide on the surface. The tantalum dopant concentration in the surface oxide layer of the etched Ti-2Ta alloy is higher than that of the grinded Ti-2Ta alloy. The surface electrical contact resistance of the grinded and etched Ti-2Ta alloy was measured with carbon felt (TGP-H-060 Toray Paper) with the compression pressure range of 35-300 psi and is summarized in Table 3. Table 3 shows that the etched Ti-2Ta has lower electrical contact resistance than that of the grinded Ti-2Ta, due to the higher Ta concentration in the surface oxide layer.

TABLE 3

Electrical contact resistance of fresh Ti—2Ta with carbon felt

| Compression Pressure (PSI) | Electrical Contact Resistance (mΩ · cm$^2$) | |
|---|---|---|
| | Grinded Ti—2Ta | Etched Ti—2Ta |
| 35 | 75.44 | 31.73 |
| 51 | 62.69 | 23.26 |
| 91 | 39.61 | 11.82 |
| 150 | 25.44 | 6.94 |
| 201 | 19.16 | 5.08 |
| 251 | 15.16 | 3.95 |
| 300 | 12.64 | 3.26 |

The difference of the contact resistance between the grinded and etched Ti-2Ta becomes much bigger with a thicker oxide surface layer. The grinded and etched Ti-2Ta alloys were thermally oxidized in air at 300° C. for 1 hour.

Their electrical contact resistances were measured with carbon felt, the same way as the fresh alloy, and is summarized in Table 4. Table 4 shows that the contact resistance of carbon felt with thermally oxidized grinded Ti-2Ta is 120.56 mΩ·cm² at 150 psi compression pressure. The contact resistance of carbon felt with thermally oxidized etched Ti-2Ta is 27.09 mΩ·cm² at 150 psi compression pressure, which is much lower than that of grinded Ti-2Ta.

TABLE 4

Electrical contact resistance of thermally oxidized Ti—2Ta with carbon felt

| Compression Pressure (PSI) | Electrical Contact Resistance (mΩ · cm²) | |
|---|---|---|
| | Grinded Ti—2Ta | Etched Ti—2Ta |
| 35 | 357.43 | 94.65 |
| 51 | 294.71 | 72.59 |
| 91 | 187.69 | 43.05 |
| 150 | 120.56 | 27.09 |
| 201 | 91.51 | 20.52 |
| 251 | 72.61 | 16.31 |
| 300 | 60.46 | 13.62 |

Example 4

Figure 11:
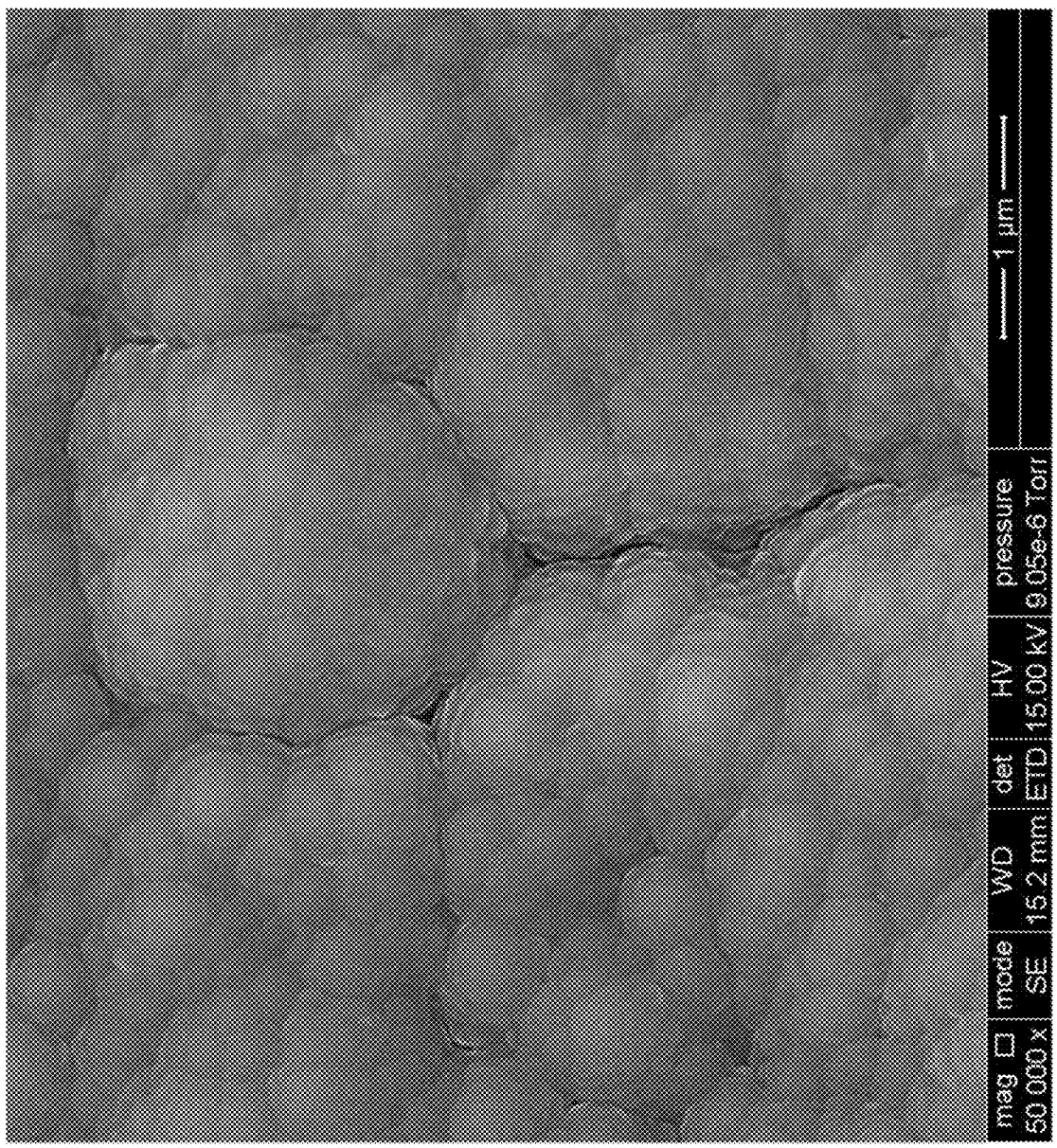
FIG. 11 is a SEM picture of as sputtered Ti2Nb-SS according to an embodiment.

A titanium-niobium binary alloy DC magnetron sputtering targets with the niobium concentration of 2% (Ti-2Nb) was prepared. It was used to deposit 5 µm thick Ti-2Nb coating on stainless steel (SS) foil surface (Ti2Nb-SS). The scanning electron microscope (SEM) picture of the sputtered Ti-2Nb on SS surface is shown in FIG. 11. It includes small grains and large grain clusters grown during the sputtering deposition process. The coating surface analysis was conducted by Energy-dispersive X-ray spectroscopy (EDS) and AES. It was found that the bulk of the coating layer has the same composition as the target material (Ti-2Nb), but the surface layer of the as deposited Ti-2Nb layer has much lower niobium concentration. It was also found that this surface composition segregation was related to the sputtering processing condition. With different sputtering process conditions, the niobium concentration was closer to the target material.

Figure 12:
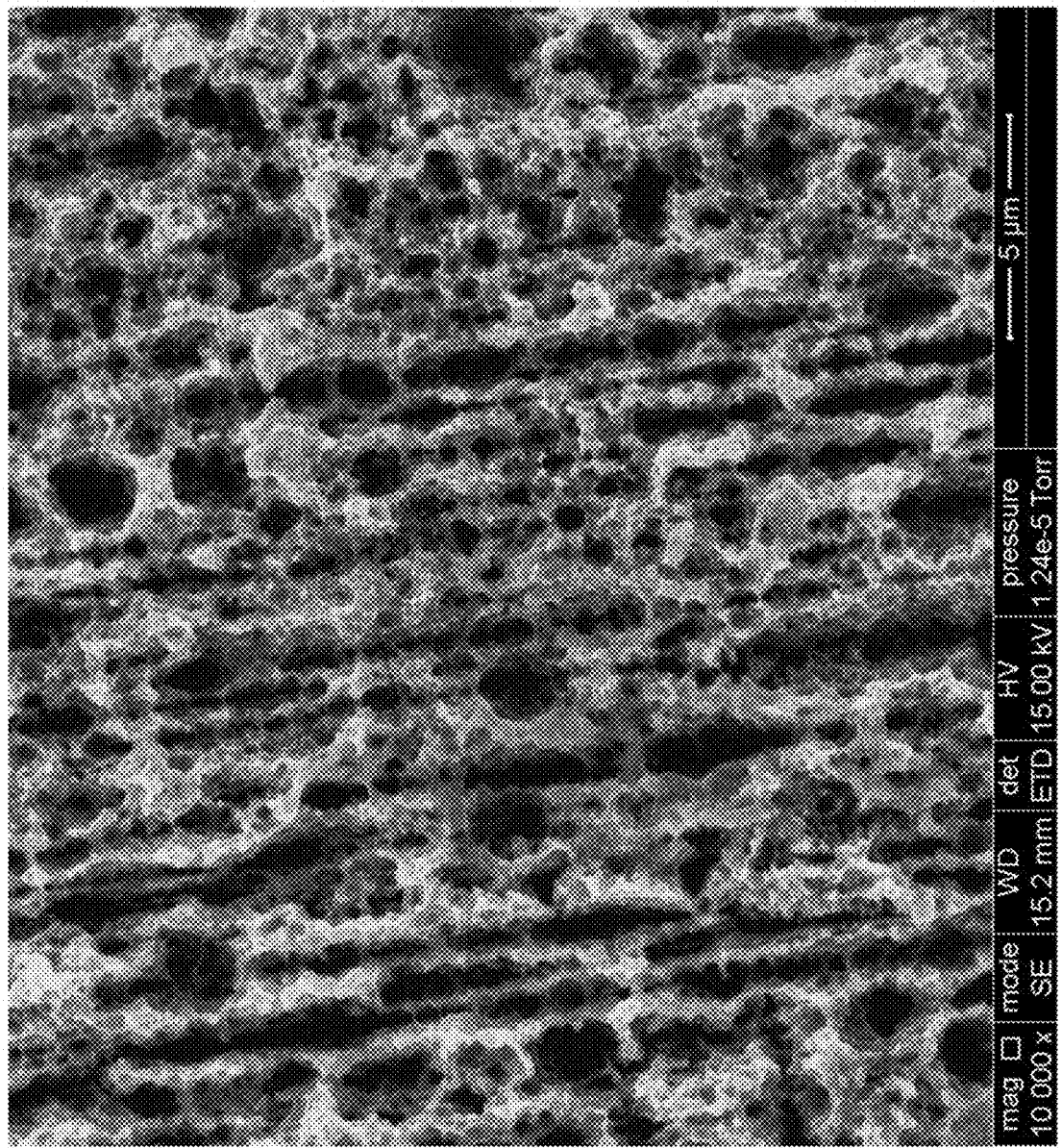
FIG. 12 is a SEM picture of as etched Ti2Nb-SS at ×10,000 magnification, according to an embodiment.
Figure 13:
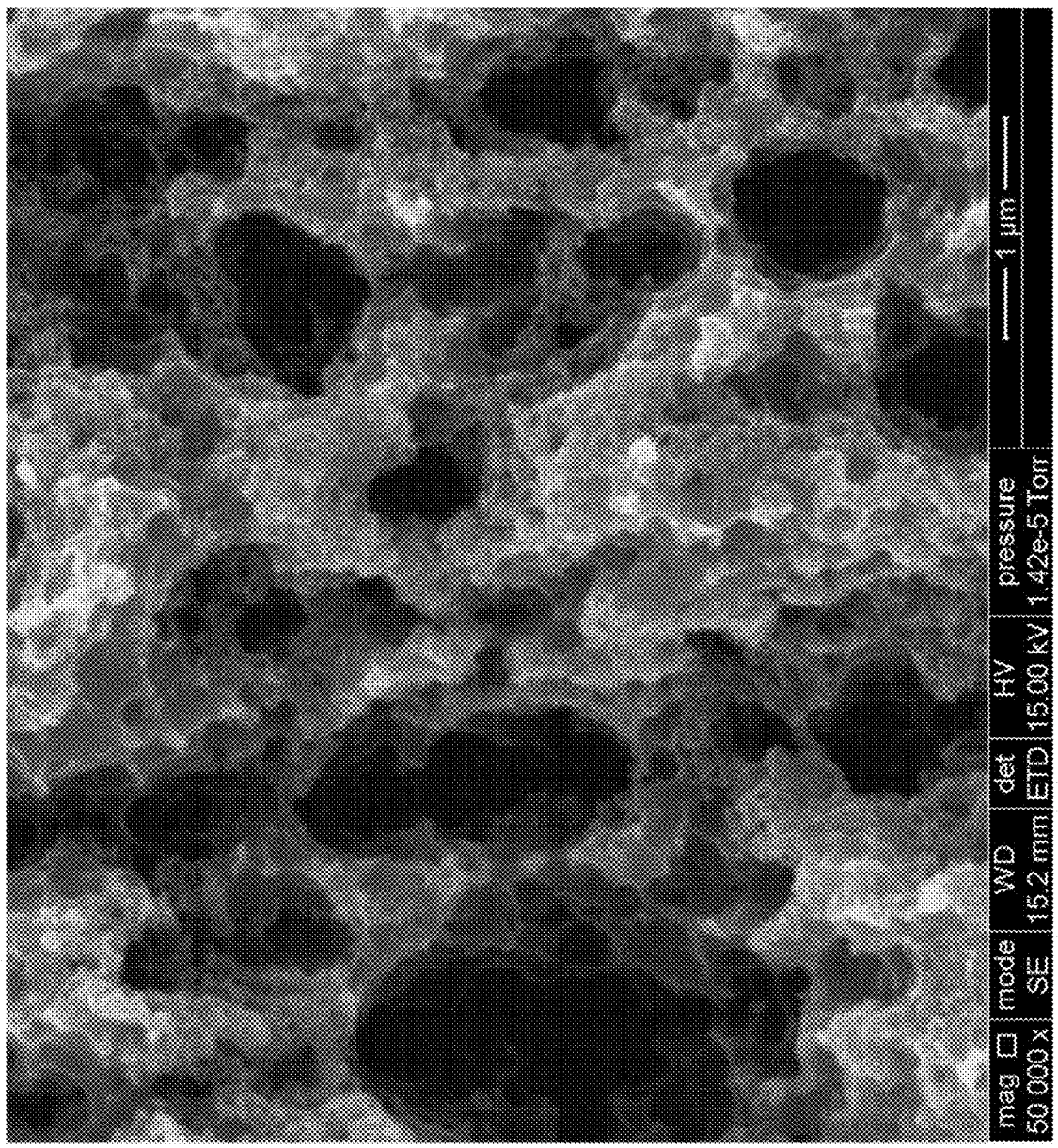
FIG. 13 is a SEM picture of as etched Ti2Nb-SS at ×50,000 magnification, according to an embodiment.

A wet chemical etching process with 2 wt % hydrofluoric acid solution for 50 seconds was used to remove the niobium depleted titanium alloy coating surface layer (etched Ti2Nb-SS). AES analysis indicated that the niobium concentration (metal base, not include oxygen, nitrogen and other absorbed impurities) of the surface oxide layer was increased to 5.7%, the estimated surface oxide thickness is less than 10 nm. The increase of niobium concentration in the surface layer was the result of the faster etching rate of titanium than niobium. FIGS. 12 and 13 are SEM pictures of the etched Ti2Nb-SS. The surface morphology of the etched Ti2Nb-SS includes many peaks and pits. The peaks have a diameter of 0.05 to 1 µm with an irregular shape. The pits have a width of 0.1 to 5 µm. These peaks and pits increase the amount of high pressure contacting points between the metal plate and other components in electrochemical devices, which will lead to lower electrical contact resistance.

To further stabilize the surface oxide layer, the SS foil with etched Ti-2Nb coating was thermally oxidized in air at 300° C. for 1 hour to grow a thicker niobium doped titanium oxide layer (oxidized Ti2Nb-SS). AES analysis was conducted on the oxidized surface. It was found that the niobium concentration (metal base, not include oxygen, nitrogen and other absorbed impurities) of the surface oxide layer was increased to 8.2%, and the surface oxide layer is about 98 nm thick. It is the evident that the thermal oxidization process can further enrich niobium in the surface oxide layer, produce an anhydrous thick oxide surface layer, which is more stable than the hydrated oxide surface layer formed during etching at ambient temperature. The high temperature process can also result in a better crystallized doped titanium oxide layer that has higher electrical conductance.

The through plate resistance of the as etched Ti2Nb-SS and oxidized Ti2Nb-SS was measured with carbon felt (TGP-H-060 Toray Paper) within the compression pressure range of 35-300 psi and is summarized in Table 5. It was found that the oxidized Ti2Nb-SS has the higher electrical contact resistance than that of etched Ti2Nb-SS.

The stability of the etched and oxidized Ti2Nb-SS was evaluated by the electrochemical corrosion tests. The coated stainless steel samples were immersed in pH 3 $H_2SO_4$+0.1 ppm HF solution at 80° C. An electrochemical potential of 0.8 $V_{NHE}$ was applied on the samples for 100 hours. Then, the through plate resistance of the corroded sample was measured and summarized in Table 5. It was found that the TPR of the etched Ti2Nb-SS was smaller than that of oxidized Ti2Nb-SS, but it had a small electrical contact resistance increase of etched Ti2Nb-SS after the corrosion. On the other hand, the oxidized Ti2Nb-SS had no electrical contact resistance increase after the corrosion, which indicates the superior corrosion resistance of the oxidized Ti2Nb-SS.

TABLE 5

Through plate resistance of etched and oxidized Ti2Nb-SS before and after the corrosion tests in pH 3 $H_2SO_4$ + 0.1 ppm HF solution at 80° C. at 0.8 $V_{NHE}$ for 100 hours.

| Compression Pressure (PSI) | Through Plate Resistance (mΩ · cm²) before and after Corrosion Tests | | | |
|---|---|---|---|---|
| | Etched Ti2Nb-SS | | Oxidized Ti2Nb-SS | |
| | Before | After | Before | After |
| 35 | 4.43 | 12.38 | 14.55 | 12.87 |
| 51 | 3.12 | 9.29 | 11.53 | 9.93 |
| 91 | 1.71 | 5.02 | 5.86 | 4.99 |
| 150 | 1.11 | 3.08 | 3.27 | 2.84 |
| 201 | 0.89 | 2.37 | 2.38 | 2.11 |
| 251 | 0.76 | 1.95 | 1.83 | 1.65 |
| 300 | 0.70 | 1.70 | 1.51 | 1.38 |

Example 5

Figure 14:
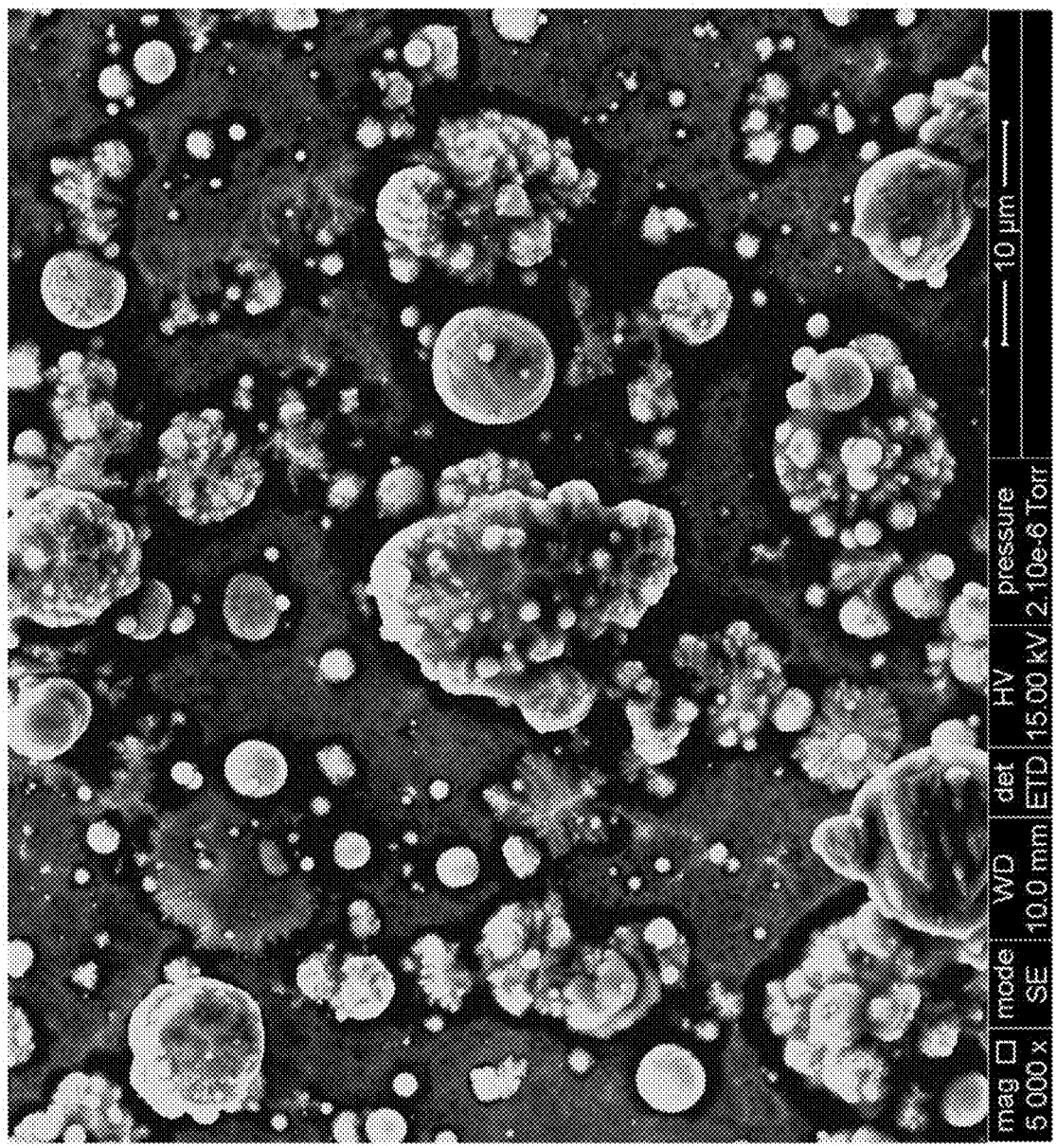
FIG. 14 is a SEM picture of a cathodic arc deposited Ti-2Nb on stainless steel surface, according to an embodiment.

A titanium-niobium binary alloy cathodic arc deposition targets with the niobium concentration of 2% (Ti-2Nb) was prepared. It was used to deposit 2 µm thick Ti-2Nb coating on stainless steel (SS) foil surface (CA Ti2Nb-SS). The scanning electron microscope (SEM) picture of the sputtered Ti-2Nb on SS surface is shown in FIG. 14. It includes small peaks that stand out of the substrate surface. The diameter of the peaks is between 0.05 µm and 10 µm. The height of the peaks is between 0.5 and 15 microns. The distribution density of the peaks is estimated of 1-10 million/cm². The coating surface analysis was conducted by EDS and XPS. It was found that the bulk and the surface layer of the coating layer have the same composition (~2% Nb in Ti) as the target material (Ti-2Nb).

Figure 15:
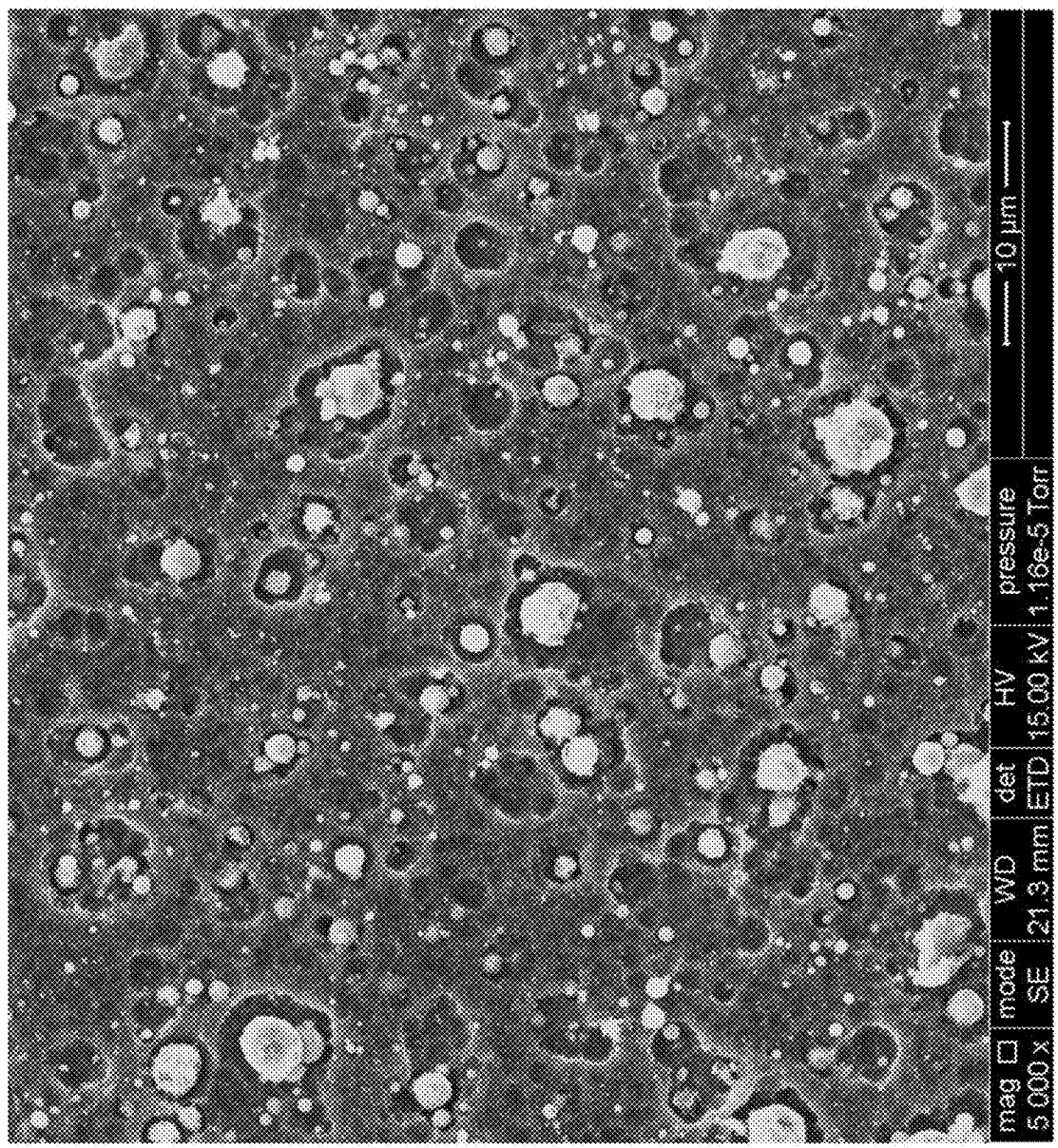
FIG. 15 is a SEM picture of an etched cathodic arc deposited Ti-2Nb on stainless steel surface, according to an embodiment.

The CA Ti2Nb-SS surface was further modified by wet chemical etching in 2 wt % hydrofluoric acid solution for 30 seconds (etched CA Ti2Nb-SS). FIG. 15 is the SEM picture of the etched CA Ti2Nb-SS. It shows that the etching step has created many pits on the surface. These pits have a sharp edge and the diameter of the holes is between 1 to 10 µm. In addition, the etched surface does not show the grain boundary of the coating material, which indicates that the coating deposited by the cathodic arc was in amorphous structure. The surface oxide layer composition of etched CA Ti2Nb-SS was analyzed by AES. It was found that the niobium concentration (metal base) in the surface oxide layer was enriched to 6.3% by the etching.

The peaks and pits on the surface will effectively increase the amount of the high pressure contacting points of the metal plates with other components, thus reducing the electrical contact resistance. The through plate resistance of the as etched Ti2Nb-SS and oxidized Ti2Nb-SS was measured with carbon felt (TGP-H-060 Toray Paper) within the compression pressure range of 35-300 psi and is summarized in Table 6. It was found that the both CA Ti2Nb-SS and etched CA Ti2Nb-SS have low TPR. The etched plate has lower resistance due to the higher niobium concentration in the doped titanium oxide surface and the additional high pressure contact points created by the pits with the sharp edges.

TABLE 6

Through plate resistance of as deposited and etched CA Ti2Nb-SS

| Compression Pressure | Through Plate Resistance (mΩ · cm$^2$) | |
| --- | --- | --- |
| (PSI) | CA Ti2Nb-SS | Etched CA Ti2Nb-SS |
| 35 | 18.36 | 4.12 |
| 51 | 12.97 | 3.27 |
| 91 | 6.95 | 2.08 |
| 150 | 4.17 | 1.48 |
| 201 | 3.15 | 1.25 |
| 251 | 2.55 | 1.11 |
| 300 | 2.19 | 1.02 |

Example 6

The titanium plate surface is blasted with sand to create small peaks and pits on the surface. The sand has the average particle size between 22 and 0.1 microns (#400 and finer). The finished surface has peaks with the dimension (width) of 0.01-1 microns, and the pits with the dimension (width and depth) of 1-20 microns.

The sand blasted titanium plate surface is coated with a thin layer of a Ti-2Nb alloy by a PVD process. The thickness of the Ti-2Nb coating is 0.005-5 µm. A semi-conductive niobium doped titanium oxide surface layer is formed naturally on the coated titanium plate. An etching step can be applied to modify the composition of surface oxide layer to further improve the surface electrical conductance of the doped titanium oxide layer with higher concentrations of the dopant element, such as niobium.

The coated titanium alloy can be used in fuel cells, electrolyzers and capacitors to reduce their internal electrical resistance. Depending on the application requirement, the thickness of the niobium doped titanium oxide surface layer can be increased by an oxidization process. The oxidization process can be plasma oxidizing, anodizing (electrical oxidizing), chemical oxidizing in solutions with oxidizing agents and thermal oxidizing at elevated temperature in oxygen containing atmosphere.

The preferred oxidizing method is thermal oxidization in air. The temperature is between 100-600° C. The atmosphere could also be at different pressure (from high pressure to vacuum) and with other oxygen containing compounds, such as steam and carbon dioxide for better quality of the surface oxide layer.

Example 7

A titanium-niobium binary alloy DC magnetron sputtering targets with the niobium concentration of 2% (Ti-2Nb) was prepared. It was used to deposit a 5 µm thick Ti-2Nb coating on a stainless steel (SS) foil surface. The Ti-2Nb coated SS was then placed in a PE-200RIE reactive plasma etching system from Plasma Etch, Inc. The etching condition was 100 W for 30 minutes, with an $O_2$ flow rate of 15 mil/min and a $CF_4$ flow rate of 85 ml/min. The vacuum was at about 0.2 torr. The through plate resistance of the as etched Ti-2Nb coated SS was measured with carbon felt (TGP-H-060 Toray Paper). It was found that the through plate resistance of reactive plasma etched Ti-2Nb coated stainless steel was reduced to 7.58 mΩ·cm$^2$ at 150 psi compression pressure. The AES surface analysis found the niobium concentration in the surface oxide layer was enriched to 18%.

Example 8

A titanium-niobium binary alloy DC magnetron sputtering targets with the niobium concentration of 2% (Ti-2Nb) is prepared. It was used to deposit 5 µm thick Ti-2Nb coating on a stainless steel (SS) foil surface. The Ti-2Nb coated SS was put in an aluminum vacuum chamber with $XeF_2$ particles. The foil was held in a vacuum for 60 minutes. 200 ml/min argon gas flow was maintained during the process to keep the vacuum at 0.45 torr. The through plate resistance of the as etched Ti-2Nb coated SS was measured with carbon felt (TGP-H-060 Toray Paper). It was found that the through plate resistance of reactive plasma etched Ti-2Nb coated stainless steel was reduced to 17.40 mΩ·cm$^2$ at 150 psi compression pressure.

Example 9

A titanium-niobium binary alloy DC magnetron sputtering targets with the niobium concentration of 2% (Ti-2Nb) is prepared. It was used to deposit 5 µm thick Ti-2Nb coating on a stainless steel (SS) foil surface. The Ti-2Nb coated SS was put in PE-200RIE reactive plasma etching system to be etched at different conditions. Table 7 summarized the etching conditions with the oxygen gas flow of 15 cc/min and CF4 gas flow of 85 cc/min at vacuum of 0.2 torr, and the final Nb concentration in the surface oxide layer after etched. It shows that the Nb concentration in the surface oxide layer is dramatically increased. The final concentration is related with the plasma etching power and etching time. At high etching power and long etching time, more fluorine radicals are generated and the Nb concentration enrichment is more significant in the surface oxide layer of the etched plate. This experiment indicates that the surface composition can be tailored by the etching condition. It was also found in another experiment that plasma etching at low power and short time will not enrich niobium in the surface oxide layer.

TABLE 7

Ti2Nb-SS Plasma Etching Conditions and
Nb Concentration in Surface Layer.

| Sample # | Etching Conditions | Surface layer Nb Concentration |
|---|---|---|
| 34-74-1 | 50 W, 60 min | 28.5% |
| 34-75-1 | 250 W, 60 min | 83.4% |
| 34-75-3 | 250 W, 10 min | 49.6% |

Example 10

A Ti—Nb alloy sheet with 3% of Nb is prepared vacuum melting and cold rolling. Then, the sheet is polished to obtain a smooth surface. Two pieces of samples are cut from the sheet. One pieces is oxidized in air at 400° C. for one hour, the other pieces is oxidized in air at 600° C. for 1 hour. XPS analysis was conducted on these samples. It was found that the Nb concentration in surface oxide layer of both samples was increased after the thermal oxidization. The Nb concentration of the 400° C. oxidized sample surface is 5.3%, and the 600° C. oxidized sample is 8.5%. This experiment indicates the dopant (Nb) concentration in the surface oxide layer can be controlled by the heat treatment conditions. The higher treatment temperature will result in the high Nb concentration in the oxide layer.

Example 11

A titanium-niobium binary alloy cathodic arc deposition targets with the niobium concentration of 7% (Ti-7Nb) is prepared. It is used to deposit a 2 μm thick Ti-7Nb coating on a stainless steel (SS) foil surface (CA Ti-7Nb-SS). With the proper process control, the Ti-7Nb coating layer is in single amorphous phase, with many round shape peaks on the surface. This coating can reduce the surface electrical contact resistance of the metal foil. And its resistance can be further reduced by a surface etching process using 2 wt % hydrofluoric acid solutions to create small pits on the surface, in addition to small peaks deposited by cathodic arc deposition. The niobium concentration in the surface oxide layer is also increase after the etching.

Example 12

A titanium-niobium binary alloy DC magnetron sputtering targets with the niobium concentration of 1% (Ti-7Nb) is prepared. It is used to deposit a 0.5 μm thick Ti-1Nb coating on a stainless steel (SS) foil surface. Before the coated stainless steel is exposed to air, after Ti-1Nb sputtering, the coated stainless steel is moved to another vacuum chamber. The vacuum is controlled at 0.01 mbar with chlorine and argon gas mixture flow of 200 ml/min for 2 minutes. The gaseous vacuum etching can enrich the niobium concentration on the Ti-1Nb coating surface to increase the surface electrical conductance of the coated stainless steel.

Example 13

A stainless steel surface is coated with a thin layer of titanium by e-beam evaporation. The finished surface has peaks with the dimension (width) of 0.01-1 microns, and the valley with the dimension (width and depth) of 1-20 microns.

A Ti-2Ta alloy coating is applied on the titanium coated stainless steel surface to obtain the semiconductive tantalum doped titanium oxide surface oxide layer. The thickness of the Ti-2Ta layer is between 0.005 and 0.1 microns.

The properties of the tantalum doped titanium oxide layer can be optimized by surface etching (to increase tantalum concentration in the doped oxide surface layer) and thermal oxidization (to stabilize the doped oxide surface layer).

Example 14

An aluminum foil is used as the substrate material for the current collector in Li ion batteries and capacitors. The foil is first cold rolled with a roller that has special surface texture. The texture can emboss the aluminum surface to the morphology that includes many small peaks and pits. The peaks have the dimension (width) of 0.1-1 microns, and the pits have the dimension (width and depth) of 1-20 microns A Ti-2Ta alloy coating is applied on the aluminum surface to obtain the semiconductive tantalum doped titanium oxide surface oxide layer. The thickness of the Ti-2Ta layer is between 0.005 and 0.1 microns.

The properties of the tantalum doped titanium oxide layer can be optimized by surface etching (to increase tantalum concentration in the doped oxide surface layer) and thermal oxidization (to stabilize the doped oxide surface layer).

Example 15

A niobium-titanium binary alloy DC magnetron sputtering targets with the titanium concentration of 2% (Nb-2Ti) is prepared. It was used to deposit a 2 μm thick Ti-2Nb coating on a stainless steel (SS) foil surface. The coated stainless steel surface is then modified with 30% sodium hydroxide+10% hydrogen peroxide mixture solution at room temperature. The solution will slowly etch the niobium alloy coating to modify the surface oxide layer composition and create small pits on the surface for low surface electrical contact resistance.

Example 16

A porous Ti disk with proper pore size is selected as the gas diffusion layer of a water electrolyzer. The diameter of the disk is 8". The disk is soaked in 500 ml 1.5 wt % hydrofluoric acid solution for 60 minutes for surface etching. This etching process creates small titanium peaks on surface. These peaks decrease the electrical contact resistance of the gas diffusion layer with electrode catalyst and the bipolar plate of the electrilyzer cells.

Example 17

A titanium-niobium alloy powder with the niobium concentration of 1% (Ti-1Nb) is used to make porous Ti-1Nb porous Ti-1Nb plates as the gas diffusion layer for PEM electrolyzers. After the high temperature sinter step to build solid porous structures, the plate is etched in 2 wt % hydrofluoric acid solution for 30 seconds. The etching step enriches the niobium concentration on the surface of the porous Ti-1Nb plate to 7-9%. Then, the oxide surface layer with the high niobium concentration is grown on the plate surface, for the low surface contact resistance with electrode catalyst and bipolar plates.

Example 18

A 316L stainless steel plate is used as the substrate. The plate surface is rapidly melted and recrystallized by high intensity laser scanning on the surface. This melt/recrystallization process will reduce the grain size of stainless steel from typical 5-10 µm to less than 5 µm. Then, the plate is immersed in stainless steel etchant solution for 15 seconds. The etchant solution contains 15% ferric chloride, 3% copper ammonium chloride, 25% hydrochloric acid in distilled water. The etched plate has a micro-textured surface structure. The stand-outs on the surface are the same size as the fine grain (<5 µm) after the surface recrystallization. Then, the micro-textured stainless plate is coated with 10 nm thick Ti by sputtering process. The Ti coated, micro-textured stainless steel will have low surface electrical contact resistance.

Example 19

A titanium plate is used as the substrate. The plate surface is deposited with a layer of Ti particles with the particle size between 0.5-5 µm on the plate surface. The particle density on the surface is between 50-500 million particles/cm². Then, the surface is rapidly scanned by high intensity layer that instantly melts the particles. The scan time is very short that the substrate surface is not or not significantly melted. Then the melted Ti particles are cooled and bonded on the Ti plate surface in the form of round peaks with the distribution density of 50-500 million peaks/cm². These peaks perform as high pressure contacting points with other components to reduce the surface electrical contact resistance.

Example 20

In this example, stainless steel is used as the substrate. A thermal spray process is used to deposit small stainless steel powder to form a micro-textured stainless steel having small stainless steel peaks on the substrate surface. The particle size of the stainless steel powder is 0.5-5 µm. The spray process is controlled to having low velocity and a relatively cold condition of the melted stainless particles that avoid flat splats deposited on the substrate surface. The finished peaks have the diameter of 1-10 µm and the high of 0.2-5 µm. Then, the micro-textured stainless steel is coated with 50 nm thick of Ti-2Nb alloy by DC magnetron sputtering process. The surface oxide layer of the Ti-2Nb alloy will protect the stainless steel from corrosion and maintain a low surface electrical contact resistance.

Example 21

In this example, a titanium plate is used as the substrate. A thermal spray process is used to deposit and bond Ti-2Nb alloy powders on the substrate surface. Then, coated Ti plate is chemically etched in 3% HF solution for 120 seconds to remove the thick surface oxide layer formed in thermal spray process, and increase the Nb concentration in the surface oxide layer of the etched plate. The etched plate is then heat treated at 300° C. for 30 minutes in air. A dense, anhydrous surface oxide is formed by the thermal oxidization, which is more corrosion resistive than the surface oxide layer formed in ambient temperature. The finished Ti plates have higher (3-15%) niobium concentration (metal base) in the surface oxide layer, which results in the low surface electrical resistance and high corrosion resistance for electrolyzer applications.

As mentioned above, it should be appreciated that embodiments disclosed herein are not limited to the specific features discussed above. For example, the growing conditions listed herein are mere examples and it should be appreciated that the growing can occur before the substrate is placed within the device or after. The exact process used (i.e., thermal oxidation, anodizing, plasma oxidation) will depend on the type of application or processing costs.

The foregoing examples are provided merely for the purpose of explanation and are in no way to be construed as limiting. While reference to various embodiments is made, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

What is claims is:

1. A method for forming a metallic component surface to achieve surface lower electrical contact resistance, comprising:
   modifying a surface of the metallic component using a cathodic arc deposition process to form peaks on the metallic component surface to be high-pressure contact points with other solid components of a device of which the metallic component is a part;
   wherein a diameter of the peaks is between 0.1 microns and 10 microns, and an electrical contact resistance of the metallic component with other solid components is less than 10 mΩ·cm².

2. The method of claim 1, wherein each peak has a round or irregular shape.

3. The method of claim 1, further comprising using the metallic component with the modified surface as one or more metal plates of a fuel cell.

4. A metallic component having a superhydrophilic surface with low electrical contact resistance, said component comprising pits on the surface, the pits comprise holes having a diameter between 5 nm to 20 microns.

5. The metallic component of claim 4, wherein the surface comprises additional material formed thereon and the pits are naturally formed between the additional material.

6. The metallic component of claim 5, wherein the additional material comprises material thermally sprayed on to the surface or added to the surface by an additive manufacturing process.

7. The metallic component of claim 4, wherein the pits are formed in areas where materials were removed from the surface of the metallic component.

8. The metallic component of claim 7, wherein the material were removed from the surface by chemical etching, sand blasting or laser engraving.

9. The metallic component of claim 4, wherein the pits embossed features of the metallic component.

10. The metallic component of claim 9, wherein the embossed features were obtained by cold rolling of the metal component.

11. A metallic component having low electrical contact resistance, said component comprising:
   peaks formed on a surface of the metallic component using a cathodic arc deposition process, the peaks being high-pressure contact points with other solid components of a device of which the metallic component is a part;
   wherein a diameter of the peaks is between 0.1 microns and 10 microns, and an electrical contact resistance of the metallic component with other solid components is less than 10 mΩ·cm².

12. The metallic component of claim 11, wherein each peak has a round or irregular shape.

13. The metallic component of claim 11, further comprising using the metallic component as one or more metal plates of a fuel cell.

\* \* \* \* \*